United States Patent
Oh et al.

(10) Patent No.: US 12,020,628 B2
(45) Date of Patent: Jun. 25, 2024

(54) DISPLAY MODULE AND DISPLAY APPARATUS HAVING THE SAME

(71) Applicant: SAMSUNG ELECTRONICS CO., LTD., Suwon-si (KR)

(72) Inventors: Jongsu Oh, Suwon-si (KR); Sangyoung Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/941,853

(22) Filed: Sep. 9, 2022

(65) Prior Publication Data

US 2023/0005416 A1 Jan. 5, 2023

Related U.S. Application Data

(63) Continuation of application No. PCT/KR2022/000766, filed on Jan. 14, 2022.

(30) Foreign Application Priority Data

Jan. 15, 2021 (KR) .................... 10-2021-0006322

(51) Int. Cl.
*G09G 3/20* (2006.01)
*H01L 25/16* (2023.01)

(52) U.S. Cl.
CPC ...... *G09G 3/2096* (2013.01); *G09G 2300/0819* (2013.01); *G09G 2300/0842* (2013.01);
(Continued)

(58) Field of Classification Search
None
See application file for complete search history.

(56) References Cited

U.S. PATENT DOCUMENTS 9,153,171 B2 10/2015 Sakariya et al.
9,626,908 B2 4/2017 Sakariya et al.
(Continued)

FOREIGN PATENT DOCUMENTS

CN 109490903 A 3/2019
CN 113223443 A 8/2021
(Continued)

OTHER PUBLICATIONS

International Search Report (PCT/ISA/210) issued May 3, 2022 by the International Searching Authority in International Patent Application No. PCT/KR2022/000766.

*Primary Examiner* — Andre L Matthews
(74) *Attorney, Agent, or Firm* — Sughrue Mion, PLLC

(57) ABSTRACT

A display module including: a module substrate; a plurality of pixels provided on the module substrate; and a plurality of micro pixel controllers provided in spaces between the plurality of pixels, and configured to supply driving current to at least two pixels of the plurality of pixels, wherein each micro pixel controller of the plurality of micro pixel controllers includes a plurality of pixel circuits configured to, based on a first voltage and a second voltage being applied to the micro controller, control an amplitude of the driving current based on the first voltage and control a pulse width of the driving current based on the second voltage, and, based on the display module being in a power saving mode, the first voltage is adjusted to decrease a brightness of the plurality of pixels.

4 Claims, 22 Drawing Sheets

(52) U.S. Cl.
CPC . *G09G 2310/08* (2013.01); *G09G 2320/0626* (2013.01); *G09G 2330/021* (2013.01); *H01L 25/167* (2013.01)

(56) References Cited

U.S. PATENT DOCUMENTS

| | | | |
|---|---|---|---|
| 9,959,815 | B2 | 5/2018 | Sakariya et al. |
| 10,380,952 | B2 | 8/2019 | Sakariya et al. |
| 10,706,766 | B2 | 7/2020 | Kim et al. |
| 10,795,004 | B2 | 10/2020 | Masuda |
| 10,796,648 | B2 | 10/2020 | Sakariya et al. |
| 10,847,077 | B2 | 11/2020 | Sakariya et al. |
| 11,138,918 | B2 | 10/2021 | Sakariya et al. |
| 11,289,016 | B2 | 3/2022 | Kim et al. |
| 11,495,171 | B2 | 11/2022 | Kim et al. |
| 11,568,787 | B2 | 1/2023 | Sakariya et al. |
| 2006/0087502 | A1 | 4/2006 | Karidis et al. |
| 2008/0297452 | A1 | 12/2008 | Roush et al. |
| 2010/0309100 | A1 | 12/2010 | Cok et al. |
| 2014/0168037 | A1* | 6/2014 | Sakariya ............... G09G 3/3233 345/82 |
| 2015/0356918 | A1 | 12/2015 | Sakariya et al. |
| 2017/0206845 | A1 | 7/2017 | Sakariya et al. |
| 2018/0182279 | A1 | 6/2018 | Sakariya et al. |
| 2018/0190211 | A1 | 7/2018 | Sakariya et al. |
| 2020/0005720 | A1 | 1/2020 | Sakariya et al. |
| 2020/0111404 | A1* | 4/2020 | Kim ..................... G09G 3/2014 |
| 2021/0020122 | A1 | 1/2021 | Sakariya et al. |
| 2021/0118353 | A1 | 4/2021 | Sakariya et al. |
| 2022/0036819 | A1* | 2/2022 | Kang .................. G09G 3/3233 |

FOREIGN PATENT DOCUMENTS

| | | |
|---|---|---|
| JP | 2018-519539 A | 7/2018 |
| KR | 10-2007-0019087 A | 2/2007 |
| KR | 10-2017-0121327 A | 11/2017 |
| KR | 10-2018-0002786 A | 1/2018 |
| KR | 10-2033108 B1 | 10/2019 |
| KR | 10-2020-0038735 A | 4/2020 |
| KR | 10-2020-0088696 A | 7/2020 |
| KR | 10-2020-0144039 A | 12/2020 |

* cited by examiner

FIG. 14
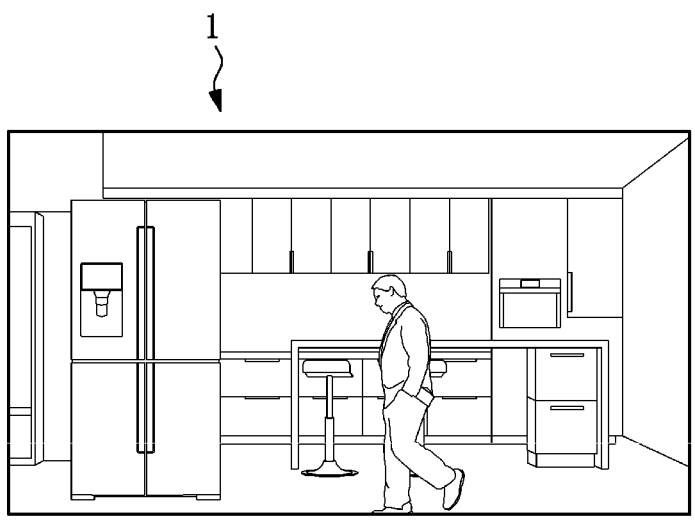
NORMAL MODE
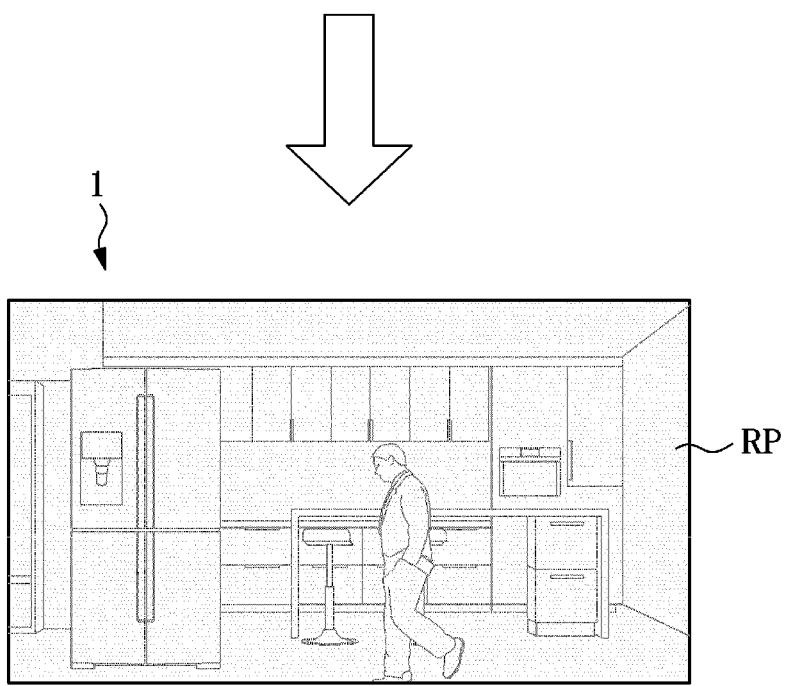
POWER SAVING MODE

DISPLAY MODULE AND DISPLAY APPARATUS HAVING THE SAME

CROSS-REFERENCE TO RELATED APPLICATION(S)

This application is a by-pass continuation of International Application No. PCT/KR2022/000766, filed on Jan. 14, 2022, which claims priority to Korean Patent Application No. 10-2021-0006322, filed on Jan. 15, 2021 in the Korean Intellectual Property Office, the disclosures of which are incorporated by reference herein in their entireties.

BACKGROUND

1. Field

The disclosure relates to a display module for generating images by using inorganic light emitting devices and a display apparatus including the display module.

2. Description of the Related Art

Display apparatuses may be classified into self-emissive displays in which pixels themselves emit light, and non-emissive displays using a separate light source.

A liquid crystal display (LCD), which is a representative non-emissive display, includes a backlight unit for supplying light from behind a display panel, a liquid crystal layer functioning as a switch for transmitting/blocking light, a color filter for changing supplied light to desired colors, etc. Accordingly, the LCD has a complicated structure and has limitation in realizing a small thickness.

On the other hand, a self-emissive display in which pixels themselves emit light because the individual pixels include light emitting devices does not require components, such as a backlight unit, a liquid crystal layer, etc., and, furthermore, the self-emissive display does not need a color filter. Accordingly, the self-emissive display has a simple structure and achieves a high degree of design freedom. Also, the self-emissive display can provide an excellent contrast ratio, brightness, and viewing angle, as well as have a thin thickness.

Among self-emissive displays, a micro light emitting diode (LED) display is a kind of flat panel display, and includes a plurality of LEDs each having a size of about 100 micrometers. The micro LED display can provide an excellent contrast, a fast response time, and high energy efficiency as compared with the LCD requiring the backlight.

Also, the micro LED, which is an inorganic light emitting device, has higher brightness, excellent light emitting efficiency, and a longer lifespan than OLEDs requiring encapsulation layers for protecting organic materials.

SUMMARY

Provided are a display module capable of facilitating circuitry inspection, circuitry replacement, a manufacturing process, and a manufacturing process of a display apparatus including the display module, by providing various circuits for driving inorganic light emitting devices in a separate chip, and a display apparatus including the display module.

Additional aspects will be set forth in part in the description which follows and, in part, will be apparent from the description, or may be learned by practice of the presented embodiments.

According to an aspect of the disclosure, there is provided a display module including: a module substrate; a plurality of pixels provided on the module substrate; and a plurality of micro pixel controllers provided in spaces between the plurality of pixels, and configured to supply driving current to at least two pixels of the plurality of pixels, wherein each micro pixel controller of the plurality of micro pixel controllers includes a plurality of pixel circuits configured to, based on a first voltage and a second voltage being applied to the micro controller, control an amplitude of the driving current based on the first voltage and control a pulse width of the driving current based on the second voltage, and, based on the display module being in a power saving mode, the first voltage is adjusted to decrease a brightness of the plurality of pixels.

The display module may further include a first wiring through which the first voltage is applied.

Micro pixel controllers of a first group, that are adjacent to each other in a column direction, among the plurality of micro pixel controllers, may be configured to receive the first voltage through the first wiring.

Each micro pixel controller of the micro pixel controllers of the first group may be configured to transfer the first voltage to another micro pixel controller adjacent to the micro pixel controller in a row direction.

Micro pixel controllers of a first group, that are adjacent to each other in a row direction, among the plurality of micro pixel controllers, may be configured to receive the first voltage through the first wiring.

Each micro pixel controller of the micro pixel controllers of the first group may be configured to transfer the first voltage to another micro pixel controller adjacent to the micro pixel controller in a column direction.

The display module may further include a plurality of second wirings diverging from the first wiring.

Each second wiring of the plurality of second wirings may be configured to transfer the first voltage to micro pixel controllers adjacent to each other in a row direction, among the plurality of micro pixel controllers.

Each second wiring of the plurality of second wirings may be configured to transfer the first voltage to micro pixel controllers adjacent to each other in a column direction, among the plurality of micro pixel controllers.

According to an aspect of the disclosure, there is provided a display apparatus including: a module substrate; a plurality of pixels provided on the module substrate; a plurality of micro pixel controllers provided in spaces between the plurality of pixels, and configured to supply driving current to at least two pixels of the plurality of pixels; and a driver integrated circuit (IC) configured to apply a first voltage and a second voltage to the plurality of micro pixel controllers, wherein each micro pixel controller of the plurality of micro pixel controllers includes a plurality of pixel circuits configured to control an amplitude of the driving current according to the first voltage and control a pulse width of the driving current according to the second voltage, and the driver IC is further configured to, based on the display apparatus being in a power saving mode, apply the first voltage increased or decreased to decrease a brightness of the plurality of pixels.

The display apparatus may further include a first wiring through which the first voltage is applied by the driver IC.

Micro pixel controllers of a first group, adjacent to each other in a column direction, among the plurality of micro pixel controllers, may be further configured to receive the first voltage through the first wiring.

Each micro pixel controller of the micro pixel controllers of the first group may be further configured to the first voltage to another micro pixel controller adjacent to the micro pixel controller in a row direction.

Micro pixel controllers of a first group, adjacent to each other in a row direction, among the plurality of micro pixel controllers, may be configured to receive the first voltage through the first wiring, and each micro pixel controller of the micro pixel controllers of the first group may be configured to transfer the first voltage to another micro pixel controller adjacent to the micro pixel controller in a column direction.

The display apparatus may further include a plurality of second wirings diverging from the first wiring, and each second wiring of the plurality of second wirings may be configured to transfer the first voltage to micro pixel controllers adjacent to each other in a row direction, among the plurality of micro pixel controllers.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 14 is a diagram illustrating a brightness difference between a case in which a display apparatus according to an embodiment of the disclosure operates in a normal mode and a case in which the display apparatus operates in a power saving mode;

DETAILED DESCRIPTION

Figure 1:
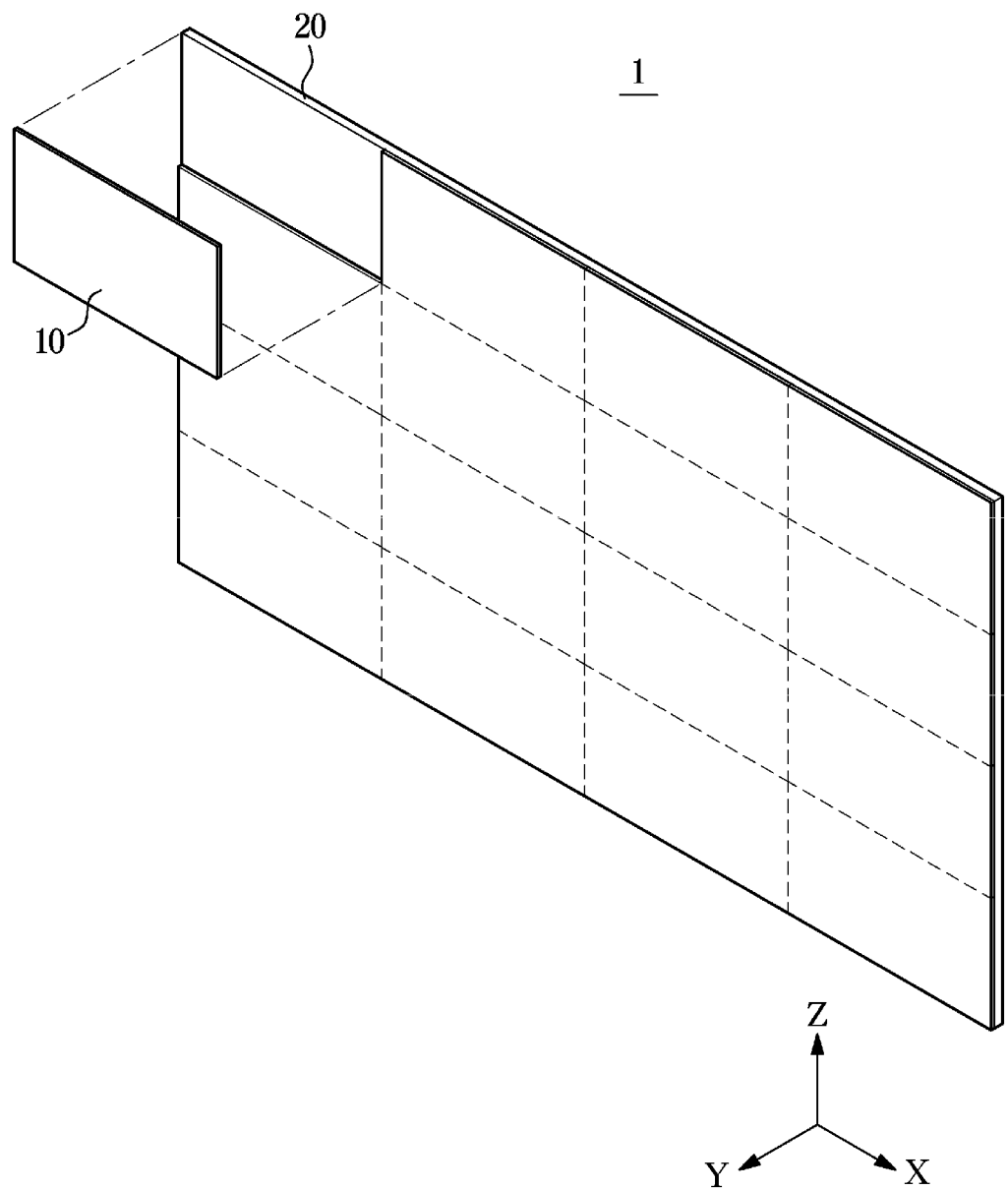
FIG. 1 is a diagram showing examples of a display module according to an embodiment of the disclosure and a display apparatus including the display module.

Like reference numerals will refer to like components throughout this specification. This specification does not describe all components of the embodiments, and general information in the technical field to which the disclosure belongs or overlapping information between the embodiments will not be described. As used herein, the terms "portion", "part, "module, "member" or "block" may be implemented as software or hardware, and according to embodiments, a plurality of "portions", "parts, "modules, "members" or "blocks" may be implemented as a single component, or a single "portion", "part, "module, "member" or "block" may include a plurality of components.

It will be understood that when a certain part is referred to as being "connected" to another part, it can be directly or indirectly connected to the other part. When a certain part is indirectly connected to another part, it may be connected to the other part through a wireless communication network or electrically connected to the other part by wiring, soldering, etc.

Also, it will be understood that when a certain part "includes" a certain component, the part does not exclude another component but can further include another component, unless the context clearly dictates otherwise.

In the entire specification, it will also be understood that when a certain element is referred to as being "on" or "over" another element, it can be directly on the other element or intervening elements may also be present.

In the entire specification, it will also be understood that when a certain component transfers or transmits a signal or data to another component, a case in which another component exists between the corresponding component and the other component and the signal or data is transferred or transmitted through the other component is not excluded, unless the context clearly dictates otherwise.

Also, it will be understood that, although the terms including ordinal numbers, such as "first", "second", etc., may be used herein to distinguish a plurality of components from each other, and the ordinal numbers do not indicate arrangement orders of the components, manufacturing orders of the components, degrees of importance of the components, etc.

It is to be understood that the singular forms "a," "an," and "the" include plural referents unless the context clearly dictates otherwise.

Reference numerals used in operations are provided to indicate the operations, without describing the order of the operations, and the operations may be executed in a different order from the stated order unless a specific order is definitely specified in the context.

Throughout the disclosure, the expression "at least one of a, b or c" indicates only a, only b, only c, both a and b, both a and c, both b and c, all of a, b, and c, or variations thereof.

Hereinafter, embodiments of a display module according to an aspect of the disclosure and a display apparatus including the display module will be described in detail with reference to the accompanying drawings.

FIG. 1 is a diagram showing examples of a display module according to an embodiment of the disclosure and a display apparatus including the display module.

A display apparatus according to an embodiment of the disclosure may be a self-emissive display apparatus in which individual pixels include light-emitting devices and themselves emit light. Accordingly, because the display apparatus does not require components, such as a backlight unit, a liquid crystal layer, etc., unlike a liquid crystal display (LCD), the display apparatus may implement a thin thickness, have a simple structure, and allow various design modifications.

Also, the display apparatus according to an embodiment of the disclosure may adopt, as a light emitting device positioned in each pixel, an inorganic light emitting device such as an inorganic light emitting diode. The inorganic light emitting device may have a fast response speed compared with an organic light emitting device such as an organic light emitting diode (OLED), and implement high brightness with low power.

Also, the display apparatus may have high durability without requiring an encapsulation process, unlike the organic light emitting device requiring an encapsulation process and having low durability because of its vulnerability to exposure to water and oxygen. Hereinafter, an inorganic light emitting device mentioned in the following embodiments of the disclosure may be an inorganic light emitting diode.

The inorganic light emitting device adopted in the display apparatus according to an embodiment of the disclosure may be a micro light emitting diode (LED) having a shorter side of about 100 μm and a size of several tens of μm or several μm. As such, by adopting LEDs of a micro unit, a pixel size may be reduced and high resolution may be implemented within the same screen size.

Also, by manufacturing LED chips having a size of a micro unit, a problem that bending results in breaking due to characteristics of inorganic materials may be overcome. That is, because micro LED chips are not broken upon being transferred onto a flexible substrate even though the substrate is bent, a flexible display apparatus may be implemented.

A display apparatus adapting micro LEDs may be applied to various fields by using its micro pixel size and its thin thickness. For example, as shown in FIG. 1, by tiling a plurality of display modules 10 to which a plurality of micro LEDs are transferred and fixing the display modules 10 to a housing 20, a large size screen may be implemented, and a display apparatus 1 having such a large size screen may be used in a signage, an electronic board, etc.

Also, the display apparatus 1 may be implemented as a foldable display apparatus or a rollable display apparatus, based on characteristics that it is capable of being implemented as a flexible type.

A three-dimensional coordinate system of XYZ axes, as shown in FIG. 1, may be based on the display apparatus 1, wherein a plane on which a screen of the display apparatus 1 is positioned may be a XZ plane and an output direction of images or a light-emitting direction of inorganic light emitting devices may be a +Y direction. Because the coordinate system is based on the display apparatus 1, the same coordinate system may be applied to both a case in which the display apparatus 1 lies flat and a case in which the display apparatus 1 is in a standing state.

Generally, because the display apparatus 1 is used in a state in which it stands and a user watches images on a front side of the display apparatus 1, the +Y direction in which images are output may be referred to as a front direction and a direction that is opposite to the front direction may be referred to as a rear direction.

Also, generally, the display apparatus 1 may be manufactured in a state in which it lies. Accordingly, a -Y direction of the display apparatus 1 may be referred to as a down direction, and the +Y direction may be also referred to as an up direction. In the following embodiments of the disclosure, the +Y direction may be referred to as an up direction or a front direction, and the -Y direction may be referred to as a down direction or a rear direction.

The remaining four sides except for upper and lower sides of the display apparatus 1 or the display module 10 which is a flat panel type may be referred to as side surfaces regardless of a position of the display apparatus 1 or the display module 10.

In the examples of FIG. 1, a case in which the display apparatus 1 implements a large size screen by including a plurality of display modules is shown. However, embodiments of the display apparatus 1 are not limited to this. The display apparatus 1 may be implemented as a television (TV), a wearable device, a portable device, a monitor for a personal computer (PC), etc. by including a single display module 10.

The display module 10 may include a plurality of pixels having an M×N arrangement (M and N are integers that are greater than or equal to 2), i.e., a plurality of pixels arranged in a form of a two-dimensional matrix. In the current embodiment of the disclosure, that some components are arranged two-dimensionally may include a case in which the corresponding components are arranged on different planes being parallel to each other, as well as a case in which the components are arranged on the same plane. Also, the case in which the corresponding components are arranged on the same plane is not limited to a case in which tops of the arranged components are also located on the same plane, and the tops of the arranged components may be located on different planes being parallel to each other.

A pixel may include a plurality of sub pixels that output different colors of light to implement various colors by combining colors. For example, a pixel may be configured with at least three sub pixels that output different colors of light. More specifically, a pixel may include a red sub pixel, a green sub pixel, and a blue sub pixel corresponding to R, G, and B, respectively, wherein the red sub pixel may output red light, the green sub pixel may output green light, and the blue sub pixel may output blue light.

The sub pixels may be aligned along an X-axis direction or a Z-axis direction. However, the sub pixels may be not aligned.

Also, the sub pixels may be implemented with the same size or different sizes.

For a pixel to implement various colors, the pixel may need to include a plurality of sub pixels without any limitation on the sizes or arrangement of the sub pixels.

A pixel may be not necessarily configured with a red sub pixel outputting red light, a green sub pixel outputting green light, and a blue sub pixel outputting blue light, and the pixel may include a sub pixel outputting yellow light or white light. That is, colors or kinds of light output from the individual sub pixels and the number of the sub pixels are not limited.

However, in the following embodiments of the disclosure, for a detailed description, a case in which a pixel is configured with a red sub pixel, a green sub pixel, and a blue sub pixel will be described as an example.

As described above, the display module 10 and the display apparatus 1 according to an embodiment of the disclosure may be self-emissive displays in which individual pixels themselves emit light. Accordingly, the respective sub pixels may include different inorganic light emitting devices that emit different colors of light. For example, the red sub pixel may include a red inorganic light emitting device, the green sub pixel may include a green inorganic light emitting device, and the blue sub pixel may include a blue inorganic light emitting device.

Accordingly, in the current embodiment of the disclosure, a pixel may represent a cluster including a red inorganic light emitting device, a green inorganic light emitting device, and a blue inorganic light emitting device, and a sub pixel may be an inorganic light emitting device.

Figure 2:
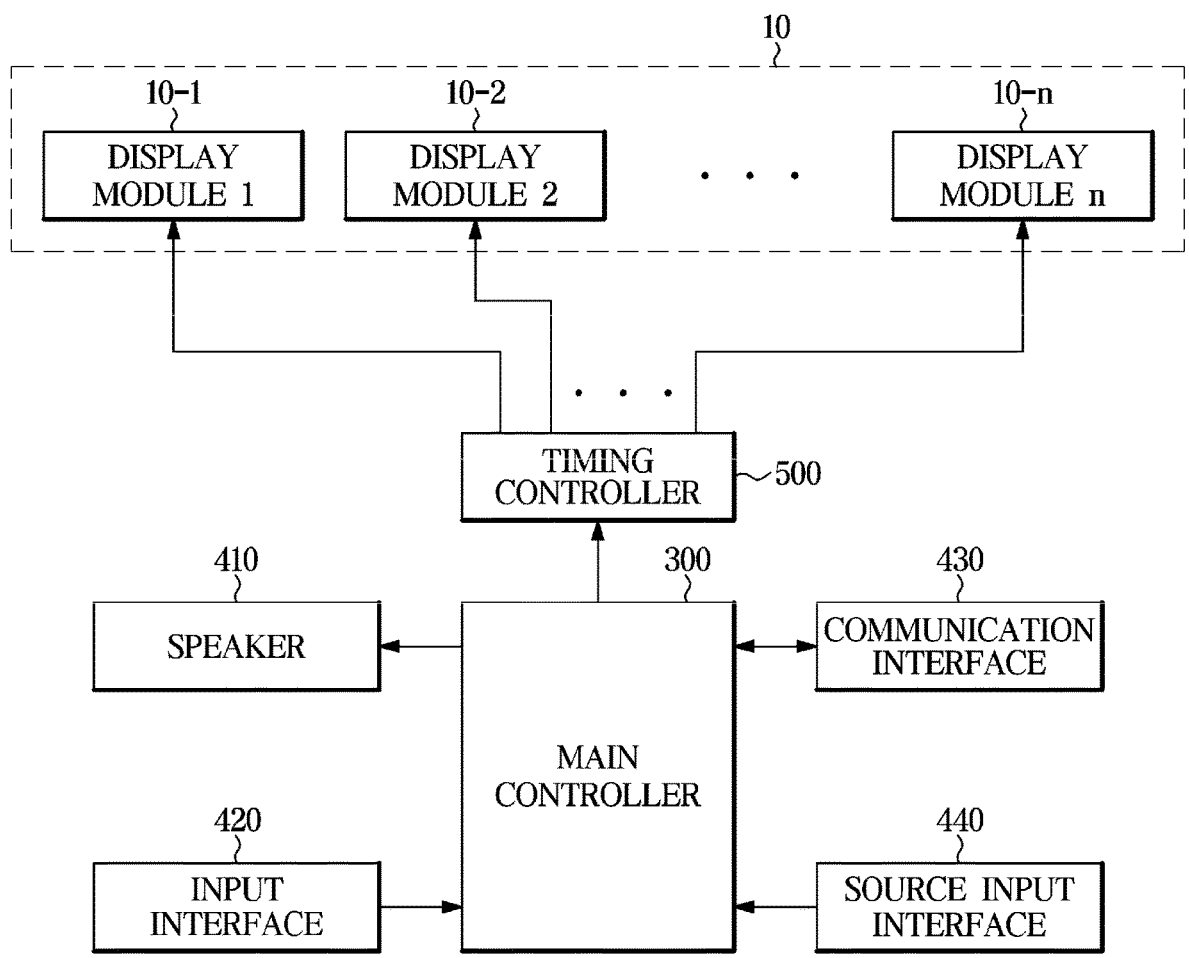
FIGS. 2 and 3 are block diagrams of a display apparatus according to embodiments of the disclosure.
Figure 3:
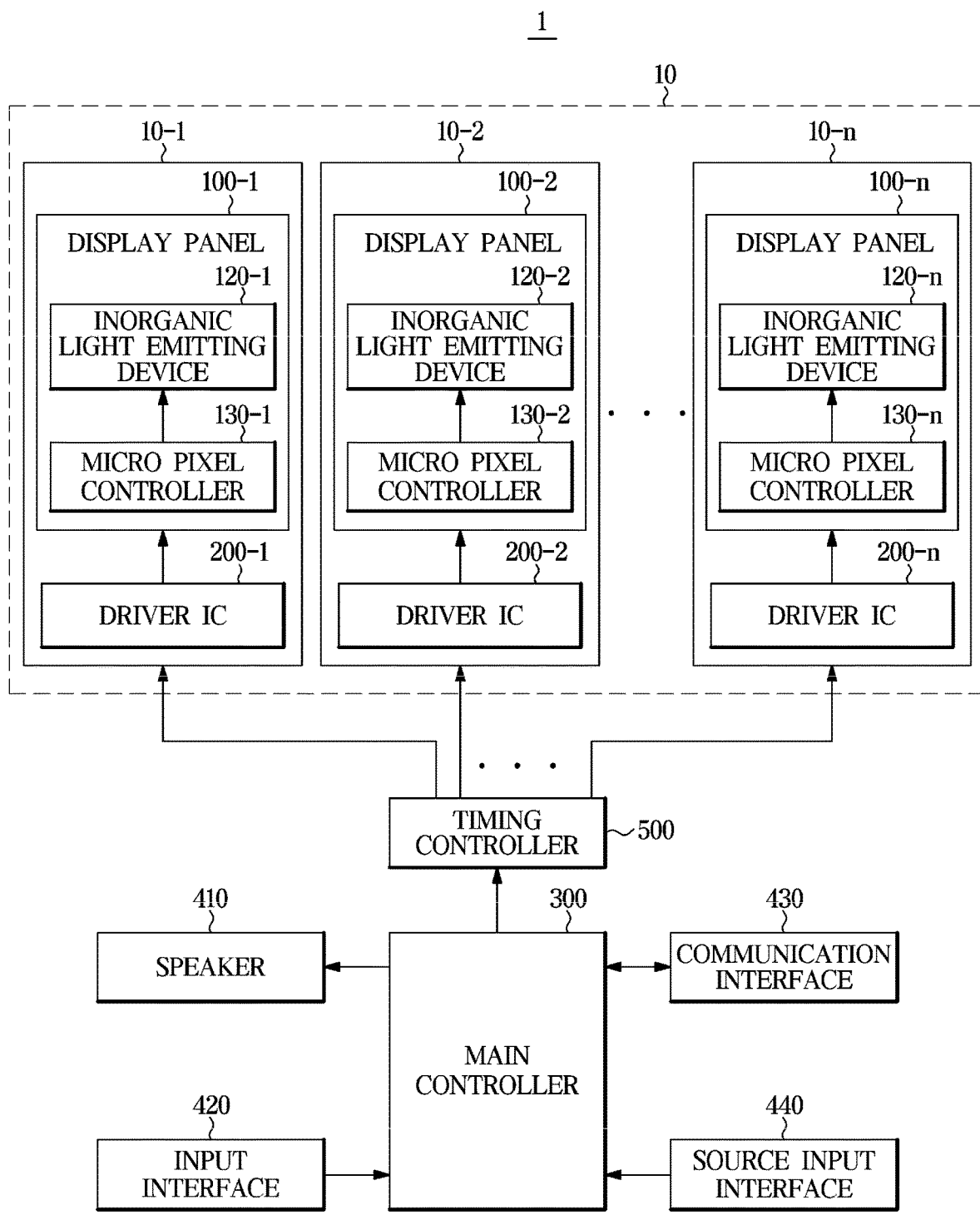

FIGS. 2 and 3 are block diagrams of a display apparatus according to embodiments of the disclosure.

Referring to FIG. 2, the display apparatus 1 according to an embodiment of the disclosure may include a plurality of display modules (10; 10-1, 10-2, . . . , 10-n, n is an integer that is greater than or equal to 2), a main controller 300 and a timing controller 500 for controlling the plurality of display modules 10, a communicator 430 for communicating with an external device, a source inputter 440 for receiving a source image, a speaker 410 for outputting sound, and an inputter 420 for receiving a command for controlling the display device 1 from a user.

The inputter 420 may include a button or a touch pad provided on an area of the display apparatus 1. In a display panel 100 (see FIG. 3) implemented as a touch screen, the inputter 420 may include a touch pad provided on a front side of the display panel 100. Also, the inputter 420 may include a remote controller.

The inputter 420 may receive, from a user, various commands for controlling the display apparatus 1, such as power on/off, volume control, channel adjustment, screen adjustment, various setting changes, etc.

The speaker 410 may be provided in an area of the housing 20, and further include a separate speaker module physically separated from the housing 20.

The communicator 430 may transmit and receive desired data by communicating with a relay server or another electronic device. The communicator 430 may adopt at least one of various wireless communication methods, such as 3Generation (3G), 4Generation (4G), wireless Local Area Network (WLAN), Wireless-Fidelity (Wi-Fi), Bluetooth, Zigbee, Wi-Fi Direct (WFD), Ultra wideband (UWB), Infrared Data Association (IrDA), Bluetooth Low Energy (BLE), Near Field Communication (NFC), Z-Wave, etc. Also, the communicator 430 may adopt a wired communication method, such as Peripheral Component Interconnect (PCI), PCI-express, Universe Serial Bus (USB), etc.

The source inputter 440 may receive a source signal through a set-top box, a USB, an antenna, etc. Accordingly, the source inputter 440 may include at least one selected from a group of source input interfaces including a HDMI cable port, a USB port, an antenna port, etc.

The source signal received by the source inputter 440 may be processed by a main controller 330 to be converted into a form capable of being output on the display panel 100 and the speaker 410.

The main controller 300 and the timing controller 500 may include at least one memory storing various data and a program for performing an operation which will be described below, and at least one processor for executing the stored program.

The main controller 300 may generate an image signal corresponding to the source signal by processing the source signal received by the source inputter 440.

For example, the main controller 330 may include a source decoder, a scaler, an image enhancer, and a graphic processor. The source decoder may decode a source signal compressed in a format of Moving Picture Experts Group (MPEG), etc., and the scaler may output image data of desired resolution through resolution conversion.

The image enhancer may enhance image quality of image data by applying various correction techniques. The graphic processor may classify each pixel of image data into RGB data, and output the RGB data together with a control signal such as a syncing signal for display timing in the display panel 100. That is, the main controller 300 may output a control signal and image data corresponding to the source signal.

The above-described operations of the main controller 300 may be an example that is applicable to the display apparatus 1, and the main controller 300 may further perform another operation or omit some of the above-described operations.

The image data and control signal output from the main controller 300 may be transferred to the timing controller 500.

The timing controller 500 may convert the image data transferred from the main controller 300 into a format of image data capable of being processed by a driver IC 200 (see FIG. 3), and generate various control signals, such as a timing control signal, etc., required for displaying the image data on the display panel 100.

However, the display apparatus 1 according to an embodiment of the disclosure may not necessarily include the plurality of display modules 10, and in the following embodiment of the disclosure, for a detailed description, operations of individual components will be described in detail based on the display apparatus 1 including the plurality of display modules 10.

Referring to FIG. 3, each of the plurality of display modules 10-1, 10-2, . . . , 10-n may include the display panels 100-1, 100-2, . . . , 100-n for displaying an image and the driver ICs 200-1, 200-2, . . . , 200-n for driving the display panels 100-1, 100-2, . . . , 100-n.

The display panels 100-1, 100-2, . . . , 100-n may include a plurality of pixels arranged two-dimensionally, and each pixel may be configured with a plurality of sub pixels for implementing various colors, as described above.

Also, as described above, the display apparatus 1 according to an embodiment of the disclosure may be a self-emissive display apparatus in which individual pixels themselves emit light. Accordingly, each sub pixel may include an inorganic light emitting device 120. That is, each of the plurality of pixels may be configured with two or more inorganic light emitting devices 120.

Each inorganic light emitting device 120-1, 120-2, . . . , 120-n may be driven by an Active Matrix (AM) method or a Passive Matrix (PM) method. In the following embodiment of the disclosure, for a detailed description, a case in which the inorganic light emitting device 120-1, 120-2, ..., 120-n is driven by the AM method will be described as an example.

In the display module 10 according to an embodiment of the disclosure, the individual inorganic light emitting devices 120-1, 120-2, ..., 120-n may be controlled independently by micro pixel controllers 130-1, 130-2, ..., 130-n, and the micro pixel controllers 130-1, 130-2, ..., 130-n may operate based on a driving signal output from the driver ICs 200-1, 200-2, ..., 200-n or a timing control signal output from the timing controller 500.

The driver ICs 200-1, 200-2, ..., 200-n may generate a data signal for representing gradation of an image based on image data transferred from the timing controller 500. The data signal may include a data voltage that is input to a pixel circuit 131P (see FIG. 5), which will be described later.

Figure 4:
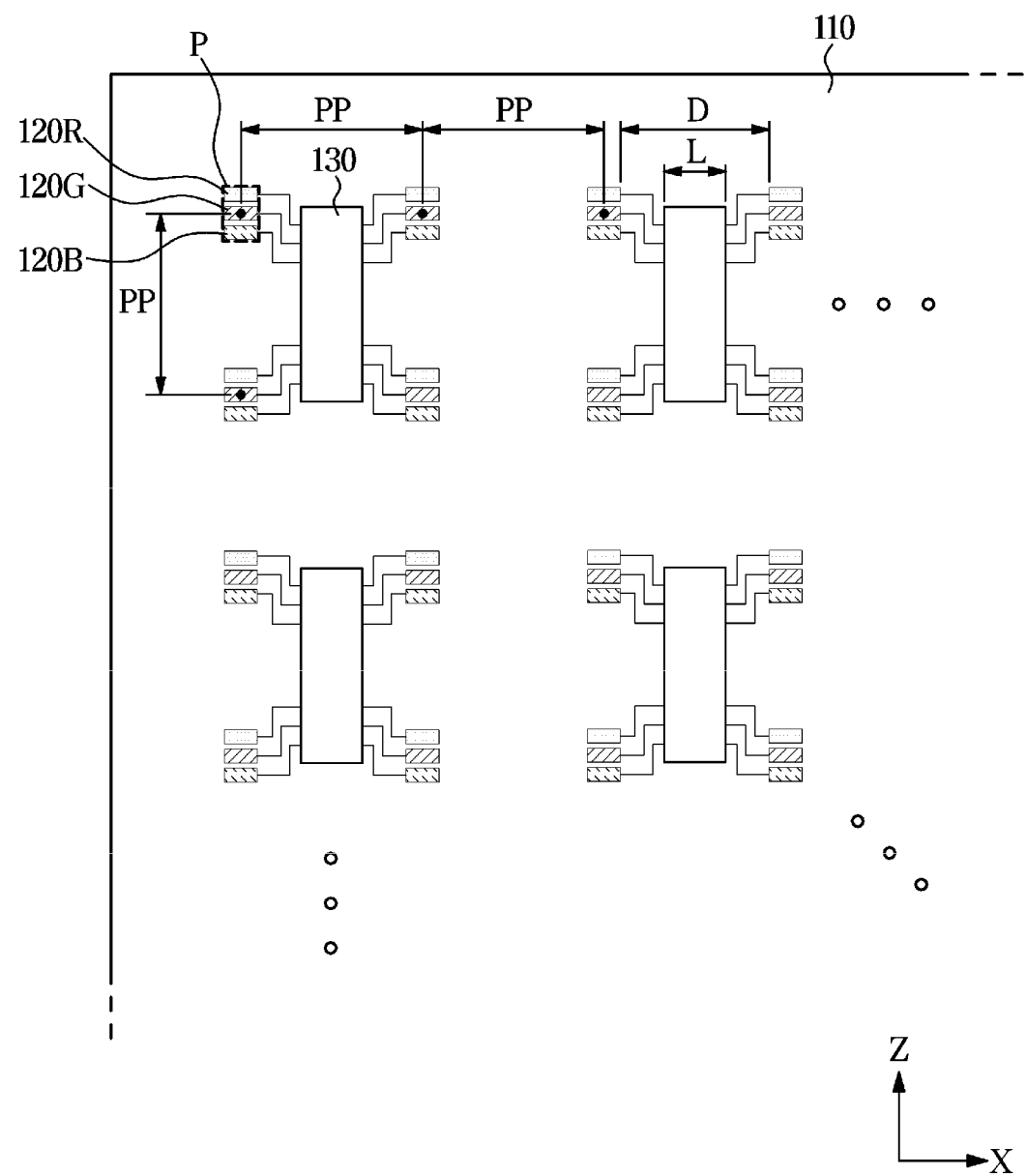
FIG. 4 is a diagram illustrating an example of an arrangement of micro pixel controllers and pixels in a display apparatus according to an embodiment of the disclosure.

FIG. 4 shows an example of an arrangement of micro pixel controllers and pixels in a display apparatus according to an embodiment of the disclosure.

In the display module 10 according to an embodiment of the disclosure, one micro pixel controller 130 may control two or more pixels P. In the following embodiment of the disclosure, a case in which one micro pixel controller 130 controls four pixels P arranged in a 2×2 form will be described as an example.

Referring to FIG. 4, the inorganic light emitting device 120 and the micro pixel controller 130 may be mounted on a module substrate 110. The module substrate 110 may be implemented as one of substrates made of various materials, such as a silicon substrate, a glass substrate, a plastic substrate, a printed circuit board (PCB), a flexible printed circuit board (FPCB), a cavity substrate, etc.

Because a pixel circuit for switching and driving the inorganic light emitting device 120 is provided in the micro pixel controller 130, instead of being directly mounted on the module substrate 110, which will be described below, circuit devices such as thin film transistors, except for an electrode pad or wirings, may not need to be formed on the module substrate 110. Accordingly, because it is not necessary to consider other limitations, such as performance of thin film transistors, etc., in selecting a kind of the module substrate 110, the module substrate 110 may be implemented as a glass substrate having excellent durability against heating of the inorganic light emitting device 120.

Also, because circuit devices, such as thin film transistors, etc., are not provided on the module substrate 110, it may be possible to prevent circuit devices from being damaged in a process of cutting the module substrate 110 and forming wirings or in a process of replacing the inorganic light emitting device 120, and to lower a difficulty level of a process of manufacturing the display module 10.

The micro pixel controller 130 may have a structure in which a pixel circuit for switching and driving the inorganic light emitting device 120 is mounted on an IC substrate. The pixel circuit for switching and driving the inorganic light emitting device 120 may include a transistor, which will be described below.

The IC substrate may also be implemented as one of substrates made of various materials, such as a silicon substrate, a glass substrate, a plastic substrate, a PCB, a FPCB, a cavity substrate, etc. Because the micro pixel controller 130 does not include a heating source such as an inorganic light emitting device, it may be possible to select a kind of a substrate without any limitation on thermal resistance of a material.

The transistor formed on the IC substrate may be a silicon-based transistor or an oxide transistor. The silicon-based transistor may be an amorphous silicon (a-Si) thin film transistor, a single-crystalline thin film transistor, or a poly-crystalline silicon thin film transistor. For example, the poly-crystalline thin film transistor may be a Low Temperature Polycrystalline Silicon (LTPS) thin film transistor that is manufactured in a low temperature condition.

In a case in which the transistor included in the pixel circuit is a LTPS thin film transistor, limitation according to electron mobility in selecting an IC substrate may be generated. Because a silicon substrate has no limitation on electron mobility compared with a glass substrate, the IC substrate implemented as a silicon substrate may improve performance of the LTPS thin film transistor. In the current embodiment of the disclosure, because the inorganic light emitting device 120 which is a heating source is transferred to the module substrate 110, the IC substrate may be implemented as a silicon substrate without any limitation according to thermal resistance.

Circuitry inspection may be performed for each micro pixel controller 130 before the micro pixel controller 130 is transferred onto the module substrate 110, and a micro pixel controller 130 determined to be an adequate product by circuitry inspection may be mounted on the display module 10. Accordingly, circuitry inspection and replacement of defective products may be easy compared with a case in which a thin film transistor circuit is directly mounted on a module substrate.

As described above, the plurality of pixels P may be arranged two-dimensionally on the module substrate 10, and the micro controller 130 may be arranged on a space of the module substrate 110 on which the pixels P are not arranged.

The plurality of pixels P may be mounted on the module substrate 110 such that pixels neighboring each other in up, down, left, and right directions are arranged at the same pixel interval PP. In the current embodiment of the disclosure, that certain values are the same may include a case in which the corresponding values approximate to each other within a preset error range, as well as a case in which the corresponding values are equal to each other.

The pixel interval PP is also called a pixel pitch, and in the current embodiment of the disclosure, the pixel interval PP may be defined as a distance between a center of a pixel and a center of the neighboring pixel. However, embodiments of the display module 10 are not limited to this, and the pixel interval PP may be defined differently.

For example, in the case of the micro pixel controller 130 having a rectangular parallelepiped shape, the micro pixel controller 130 may be provided with a subminiature size such that a length L of a shorter side of a upper surface or a lower surface of the micro pixel controller 130 is shorter than a distance D between boundary lines of two pixels P neighboring the micro pixel controller 130 and the shorter side of the micro pixel controller 130 is positioned in parallel to a line representing a shortest distance between the two neighboring pixels P. Herein, the distance D between the boundary lines of the adjacent pixels P may mean a distance between inorganic light emitting devices 120 included in different pixels P among inorganic light emitting devices 120 neighboring each other.

The micro pixel controller 130 may be positioned without influencing a distance between the plurality of pixels P. Accordingly, by minimizing a distance between the pixels P although the micro pixel controller 130 is positioned between the pixels P, high resolution may be achieved within the same area.

The micro pixel controller 130 may supply driving current to pixels to be controlled. As shown in the example of FIG.

4, four pixels to be controlled may be provided for each micro pixel controller 130. In a case in which one pixel includes three sub pixels, that is, a red inorganic light emitting device 120R, a green inorganic light emitting device 120G, and a blue inorganic light emitting device 120B, one micro pixel controller 130 may supply driving current to 12 inorganic light emitting devices 120.

Figure 5:
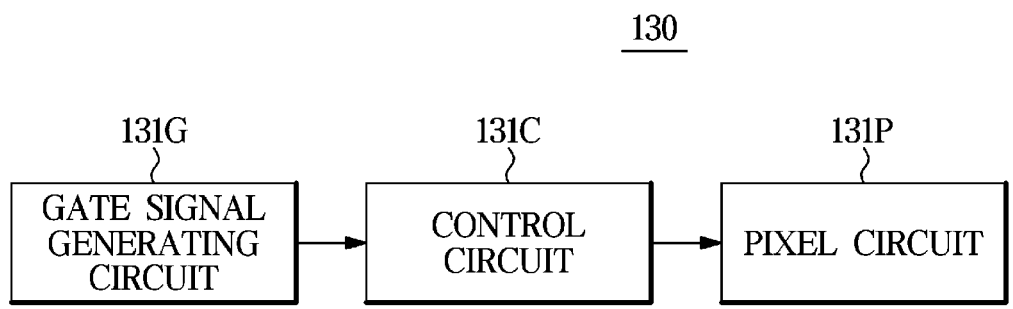
FIG. 5 is a block diagram for describing an operation of a micro pixel controller in a display apparatus according to an embodiment of the disclosure.
Figure 6:
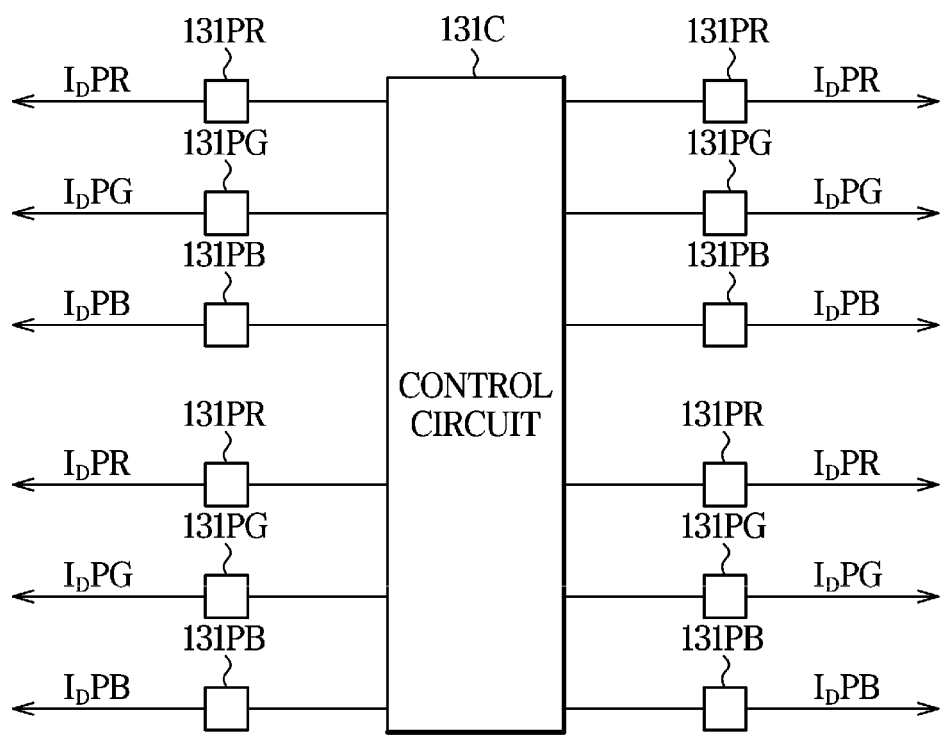
FIG. 6 is a diagram illustrating the flow of signals in a micro pixel controller in a display apparatus according to an embodiment of the disclosure.

FIG. 5 is a block diagram for describing an operation of a micro pixel controller in a display apparatus according to an embodiment of the disclosure, and FIG. 6 is a diagram illustrating the flow of signals in a micro pixel controller in a display apparatus according to an embodiment of the disclosure.

Referring to FIGS. 5 and 6, the micro pixel controller 130 may include a pixel circuit 131P for turning on/off pixels to be controlled and supplying driving current, and a control circuit 131C for appropriately distributing various signals input to the micro pixel controller 130 to the pixel circuit 131.

Also, the micro pixel controller 130 may generate a gate signal for turning on/off pixels, thereby reducing a volume and load of the driver IC 200, resolving a problem of an IR drop that is generated in a process of transferring a gate signal, and reducing wiring complexity.

The micro pixel controller 130 may include a gate signal generating circuit 131G. A timing control signal transferred from the timing controller 500 may be input to the gate signal generating circuit 131G, and the gate signal generating circuit 131G may generate a gate signal for turning on/off pixels based on the timing control signal. The timing control signal may include a clock signal and a reset signal for generating a gate pulse.

The gate signal generated by the gate signal generating circuit 131G may be distributed to each pixel circuit 131P by the control circuit 131C. The control circuit 131C may distribute the gate signal to the pixel circuit 131P at appropriate timing based on the timing control signal.

The gate signal generated by the micro pixel controller 130 may be transferred to a next micro pixel controller 130 being adjacent to the micro pixel controller 130 in a row direction (an X-axis direction). For example, a micro pixel controller 130 for controlling pixels arranged on a first column may generate a gate signal, and the gate signal may be transferred to a next micro pixel controller 130 being adjacent to the micro pixel controller 130 in the row direction.

In the current embodiment of the disclosure, micro pixel controllers 130 being adjacent to each other in the row direction may mean micro pixel controllers 130 of which pixels to be controlled are arranged on the same row, in other words, micro pixel controllers 130 for controlling pixels arranged on the same row. For example, in a case in which one micro pixel controller 130 controls pixels arranged in a 2×2 form, a plurality of micro pixel controllers 130 for controlling pixels arranged on first and second rows on the module substrate 110 may be micro pixels (micro pixel controllers?) 130 being adjacent to each other in the row direction.

Also, micro pixel controllers 130 being adjacent to each other in a column direction may be micro pixel controllers 130 of which pixels to be controlled are arranged on the same column, in other words, micro pixel controllers 130 for controlling pixels arranged on the same column. For example, in a case in which one micro pixel controller 130 controls pixels arranged in a 2×2 form, a plurality of micro pixel controllers 130 for controlling pixels arranged on first and second columns on the module substrate 110 may be micro pixel controllers 130 being adjacent to each other in the column direction.

A common wiring for transferring a gate signal may be used, or a micro pixel controller 130 which receives a gate signal may transfer the gate signal to the next micro pixel controller 130.

Also, the gate signal generating circuit 131G may be provided for each micro pixel controller 130. Alternatively, a plurality of micro pixel controllers 130 may be grouped, and one micro pixel controller 120 may generate a gate signal for each group and transfer the gate signal to the other micro pixel controllers 130 belonging to the same group.

The control circuit 131C may distribute a data signal transferred from the driver IC 200 and a gate signal generated by the gate signal generating circuit 131G to a plurality of pixel circuits 131P for driving pixels to be controlled. The control circuit 131C may appropriately distribute a plurality of signals input through one wiring to the plurality of pixel circuits 131P, thereby reducing the number of wirings required by the display panel 100 to be connected to the driver IC 200 and the timing controller 500.

In a case in which one micro pixel controller 130 controls four pixels and one pixel includes a red sub pixel, a green sub pixel and a blue sub pixel, a red sub pixel circuit 131PR, a green sub pixel circuit 131PG, and a blue sub pixel circuit 131PB for each of the four pixels may be provided, as shown in the example of FIG. 6.

The red sub pixel circuit 131PR may output driving current $I_DPR$ for driving the red inorganic light emitting device 120R, the green sub pixel circuit 131PG may output driving current $I_DPG$ for driving the green inorganic light emitting device 120G, and the blue sub pixel circuit 131PB may output driving current $I_DPB$ for driving the blue inorganic light emitting device 120B.

Figure 7:
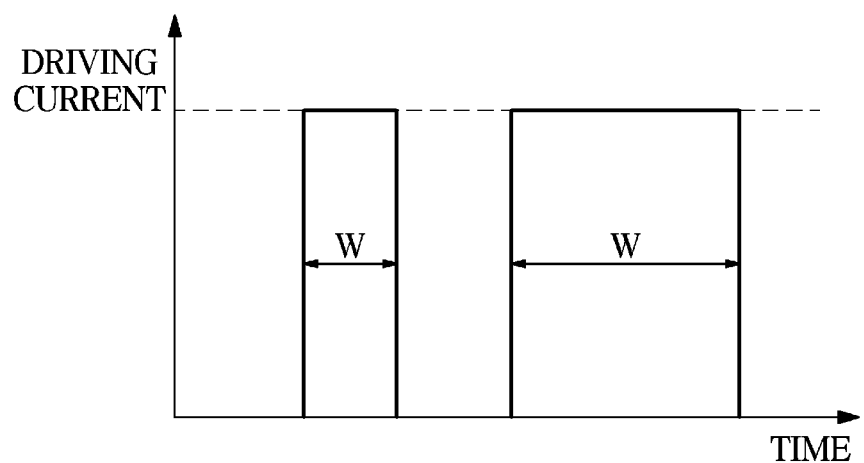
FIGS. 7 and 8 are graphs illustrating waveforms of driving current that is supplied to an inorganic light emitting device in a display apparatus according to embodiments of the disclosure.
Figure 8:
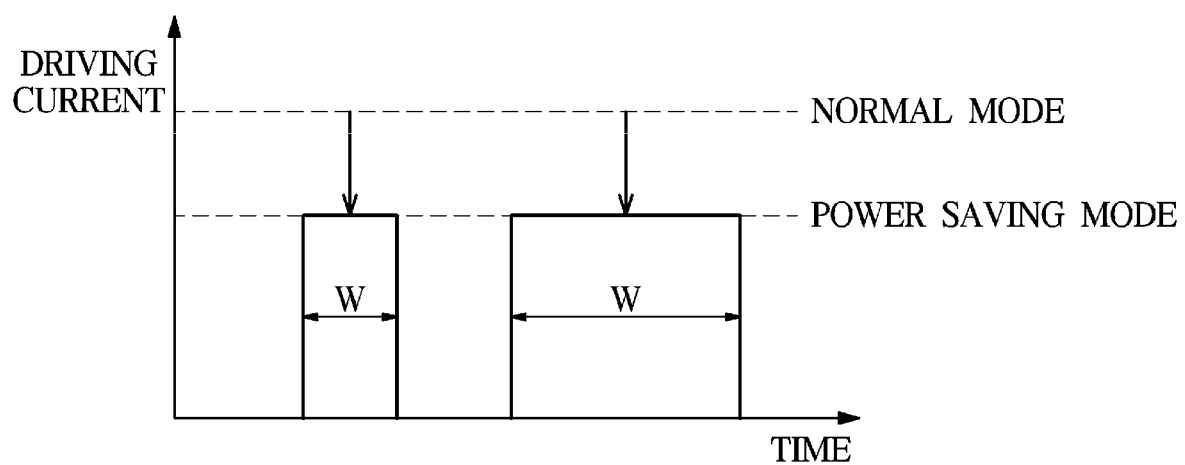

FIGS. 7 and 8 are graphs illustrating waveforms of driving current that is supplied to an inorganic light emitting device in a display apparatus according to embodiments of the disclosure.

Methods for controlling brightness of an inorganic light emitting device may include Pulse Amplitude Modulation (PAM) control of controlling an amplitude of driving current, Pulse Width Modulation (PWM) control of controlling a pulse width of driving current, and hybrid control of controlling both an amplitude and pulse width of driving current.

The display apparatus 1 according to an embodiment of the disclosure may control brightness of the inorganic light emitting device 120 by applying PWM control. As shown in FIG. 7, by controlling a duration, that is, a pulse width W of driving current $I_D$ that is supplied to the inorganic light emitting device 120 while fixing an amplitude of the driving current $I_D$, various gradations may be expressed while preventing a color shift phenomenon according to a change of current density.

Also, because the inorganic light emitting device 120 has a long lifespan without causing any burn-in phenomenon even in high current density compared with organic light emitting devices, the display apparatus 1 according to an embodiment of the disclosure may achieve high brightness by supplying high current to the inorganic light emitting device 120.

Always supplying high current to the inorganic light emitting device 120 may cause an increase of consumption power. The display apparatus 1 according to an embodiment of the disclosure may reduce consumption power by lowering an amplitude of driving current in a certain situation such as a power saving mode, as shown in FIG. 8. Hereinafter, the related configuration and operation of the display apparatus 1 will be described in detail.

Figure 9:
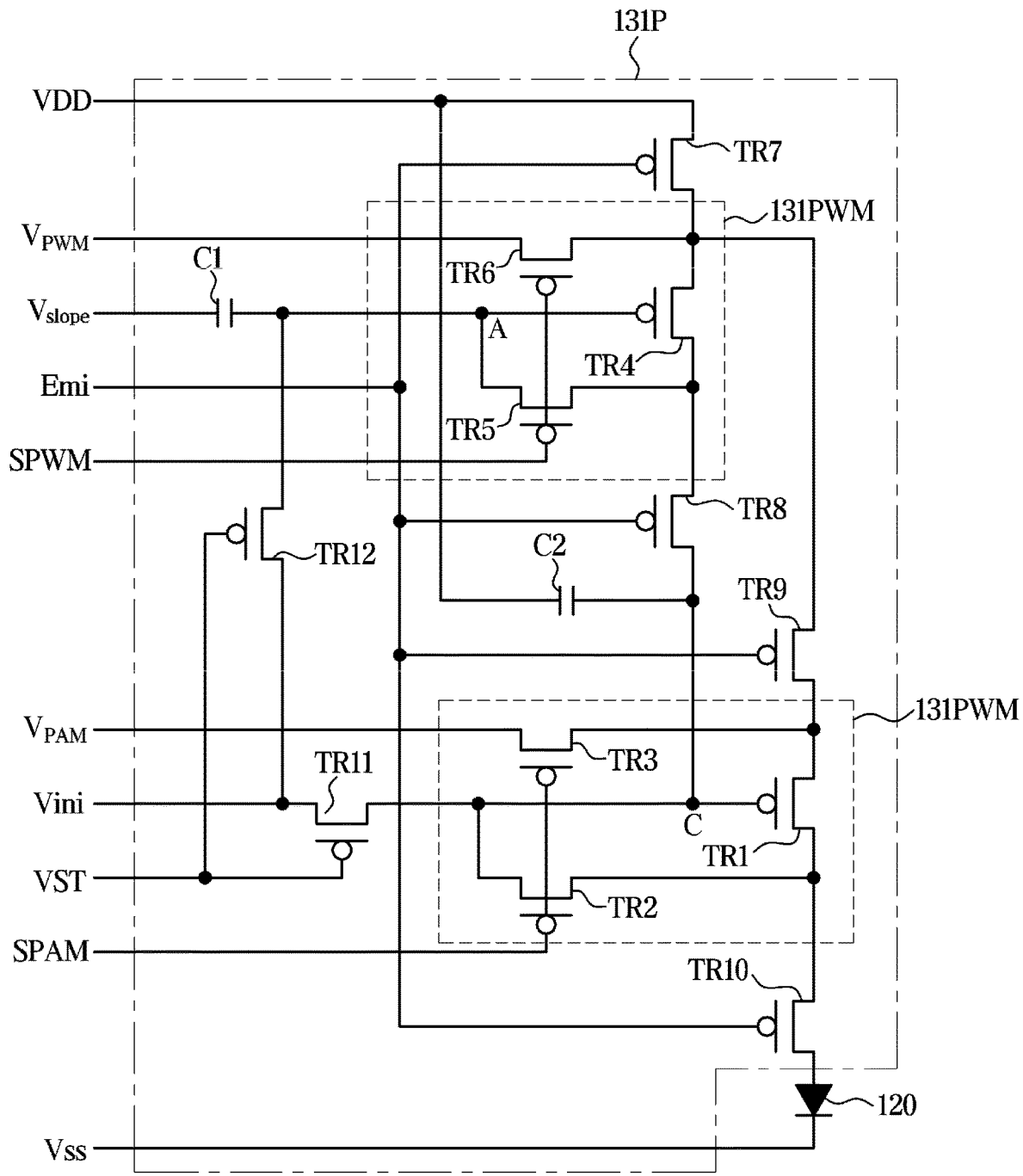
FIG. 9 is a diagram showing an example of a pixel circuit that is applicable to a display module according to an embodiment of the disclosure.

FIG. 9 is a diagram showing an example of a pixel circuit that is applicable to a display module according to an embodiment of the disclosure.

Referring to FIG. 9, the pixel circuit 131P may include a PWM control circuit 131PWM for controlling a pulse width of driving current that is supplied to the inorganic light emitting device 120, and a PAM control circuit 131PAM for controlling an amplitude of driving current that is supplied to the inorganic light emitting device 120.

Because a data signal provided from the driver IC 200 is input to the PWM control circuit 131PWM and the PAM control circuit 131PAM, the data signal may include a first voltage for controlling an amplitude of driving current and a second voltage for controlling a pulse width of driving current. Hereinafter, the first voltage is also referred to as a PAM data voltage, and the second voltage is also referred to as a PWM data voltage.

The PAM control circuit 131PAM may include a first driving transistor TR1, a first transistor TR2 connected between a drain terminal and a gate terminal of the first driving transistor TR1, and a second transistor TR3 of which a drain terminal is connected to a source terminal of the first driving transistor TR1, of which a gate terminal is connected to a gate terminal of the first transistor TR2, and which receives a PAM data voltage $V_{PAM}$ through a source terminal.

While the first and second transistors TR2 and TR3 are in a turned-on state according to a control signal SPAM, a PAM data voltage supplied from the driver IC 200 may be applied through the source terminal of the second transistor TR3. In this case, a voltage being a sum of the PAM data voltage and a threshold voltage of the first driving transistor TR1 may be applied to the gate terminal of the first driving transistor TR1 through the first driving transistor TR1 and the second transistor TR2 that are in the turned-on state.

The PWM control circuit 131PWM may include a second driving transistor TR4, a third transistor TR5 connected between a drain terminal and a gate terminal of the second driving transistor TR4, and a fourth transistor TR6 of which a drain terminal is connected to a source terminal of the second driving transistor TR4, of which a drain terminal is connected to a source terminal of the second driving transistor TR4, of which a gate terminal is connected to a gate terminal of the third transistor TR5, and which receives a PWM data voltage through a source terminal.

While the third and fourth transistors TR5 and TR6 are in a turned-on state according to a control signal SPWM, a PWM data voltage $V_{PWM}$ supplied from the driver IC 200 may be applied through the source terminal of the fourth transistor TR6. In this case, a voltage being a sum of the PWM data voltage and a threshold voltage of the second driving transistor TR4 may be applied to the gate terminal of the second driving transistor TR4 through the second driving transistor TR4 and the third transistor TR5 that are in the turned-on state.

A source terminal of a fifth transistor TR7 may be connected to a supply voltage (VDD) terminal of the pixel circuit 131P, and a drain terminal of the fifth transistor TR7 may be connected to the drain terminal of the fourth transistor TR6 and the source terminal of the second driving transistor TR4.

The fifth transistor TR7 may be turned on/off according to a control signal Emi to electrically connect/disconnect the PWM control circuit 131PWM to/from a supply voltage terminal.

A source terminal of a sixth transistor TR8 may be connected to the drain terminal of the second driving transistor TR4, and a drain terminal of the sixth transistor TR8 may be connected to the gate terminal of the first driving transistor TR1.

A source terminal of a seventh transistor TR9 may be connected to the source terminal of the second driving transistor TR4, the drain terminal of the fourth transistor TR6, and the drain terminal of the fifth transistor TR7, and a drain terminal of the seventh transistor TR9 may be connected to the source terminal of the first driving transistor TR1 and the drain terminal of the second transistor TR3.

The sixth transistor TR8 and the seventh transistor TR9 may be turned on/off according to a control signal Emi to electrically connect/disconnect the PWM control circuit 131PWM to/from the PAM control circuit 131PAM.

A source terminal of an eighth transistor TR10 may be connected to the drain terminal of the first driving transistor TR1, and a drain terminal of the eighth transistor TR10 may be connected to an anode terminal of a light emitting device. The eighth transistor TR10 may be turned on/off according to a control signal Emi to electrically connect/disconnect the PAM control circuit 131PAM to/from the inorganic light emitting device 120.

One end of a first capacitor C1 may be connected to the gate terminal of the second driving transistor TR4 and the drain terminal of the third transistor TR5, and a slope voltage $V_{slope}$ which changes linearly may be applied to the other end of the first capacitor C1.

A drain terminal of a ninth transistor TR11 may be connected to the gate terminal of the first driving transistor TR1 and the drain terminal of the first transistor TR2, and an initial voltage Vini may be applied to a source terminal of the ninth transistor TR11. A source terminal of a tenth transistor TR12 may be connected to the one end of the first capacitor C1, and a drain terminal of the tenth transistor TR12 may be connected to the source terminal of the ninth transistor TR11.

One end of a second capacitor C2 may be connected to the supply voltage terminal, and the other end of the second capacitor C2 may be connected to the gate terminal C of the first driving transistor TR1, the drain terminal of the first transistor TR2, the drain terminal of the ninth transistor TR11, and the drain terminal of the sixth transistor TR8.

The ninth transistor TR11 and the tenth transistor TR12 may be turned on according to a control signal VST to apply the initial voltage Vini to the gate terminal of the first driving transistor TR1 and the gate terminal of the second driving transistor TR4.

To prevent the supply voltage VDD from being coupled with the gate terminal C of the first driving transistor TR1 through the second capacitor C2 after gate terminal voltages of the first and second driving transistors TR1 and TR4 are initialized, the ninth transistor TR11 and the tenth transistor TR12 may be maintained in a turned-on state according to a control signal VST fora preset time period even after the supply voltage VDD is applied to the one end of the second capacitor C2, thereby applying the initial voltage Vini to the gate terminals of the first and second driving transistors TR1 and TR4.

A cathode terminal of the inorganic light emitting device 120 may be connected to a ground voltage (VSS) terminal.

An operation of the pixel circuit 131P will be described in detail, below. As a result of turning-on of the third and fourth transistors TR5 and TR6 according to a control signal SPWM (for example, −5 V), a PWM data voltage may pass through the fourth transistor TR6, the second driving transistor TR4, and the third transistor TR5 in this order, and a compensation voltage which is a sum of the PWM data voltage and the threshold voltage of the second driving transistor TR4 may be input to a node A. Accordingly, the compensation voltage may be stored in the first capacitor C1, and the node A may be maintained in a floating state.

The control signal SPWM may correspond to a signal (that is, a gate signal) for sequentially turning on a plurality of pixels arranged two-dimensionally in unit of a row. The control signal SPWM may be generated by the gate signal generating circuit 131G described above.

Accordingly, the third and fourth transistors TR5 and TR6 included in the PWM control circuit 131PWM may be turned on sequentially for each row, and a PWM data voltage for expressing a gradation of an image may be sequentially applied for each row.

The control signal SPAM may be a signal for turning on the PAM control circuit 131PAM, and may be generated by the gate signal generating circuit 131G, like the control signal SPWM.

According to turning-on of the first and second transistors TR2 and TR3 by the control signal SPAM, a PAM data voltage may be applied to the PAM control circuit 131PAM. At this time, PAM data voltages that are applied to a plurality of pixel circuits 131P may have the same magnitude.

During a duration, the inorganic light emitting device 120 may emit light according to an amplitude and pulse width of driving current provided from the pixel circuit 131P to express a gradation corresponding to an applied PAM data voltage and an applied PWM data voltage.

More specifically, during a duration, the fifth to eighth transistors TR7 to TR10 may be turned on according to the control signal Emi (for example, −5V), the PAM control circuit 131PAM may be electrically connected to the PWM control circuit 131PWM, and also the inorganic light emitting device 120 may be electrically connected to the supply voltage terminal.

At start time of the duration, the supply voltage VDD (for example, +5V) may be transferred to the inorganic light emitting device 120 via the fifth transistor TR7, the seventh transistor TR9, the first driving transistor TR1, and the eighth transistor TR10 through the supply voltage terminal, a voltage difference of +10V may be generated at both ends of the inorganic light emitting device 120, and accordingly, the inorganic light emitting device 120 may start emitting light. At this time, driving current that irradiates the inorganic light emitting device 120 may have a fixed amplitude corresponding to the PAM data voltage.

During the duration, the slope voltage $V_{slope}$ that changes linearly may be applied to the first capacitor C1. For example, in a case in which the slope voltage $V_{slope}$ is reduced gradually from +4V to 0V, a coupling voltage may be generated at the gate terminal of the second driving transistor TR4 that is in a floating state, through the first capacitor C1.

Accordingly, a voltage of the node A may be reduced according to the slope voltage $V_{slope}$, and in response to a reduction of the voltage of the node A to the threshold voltage of the second driving transistor TR4, the second driving transistor TR4 may be turned on from a turned-off state.

According to turning-on of the second driving transistor TR4, the supply voltage VDD (for example, +5V) may be transferred to a node C through the fifth transistor TR7, the second driving transistor TR4, and the sixth transistor TR8. Because the supply voltage VDD is +5V, the first driving transistor TR1 may be turned off according to application of the supply voltage VDD to the node C. As a result of turning-off of the first driving transistor TR1, the supply voltage VDD may not reach the light emitting device, and accordingly, the light emitting device may not emit light any longer.

As such, from time at which the supply voltage VDD (for example, +5V) is applied to the inorganic light emitting device 120 to time at which a voltage applied to the gate terminal of the second driving transistor TR4 changes to the threshold voltage of the second driving transistor TR4 according to the slope voltage $V_{slope}$, the PWM control circuit 131PWM may provide driving current to the inorganic light emitting device 120. That is, the driving current may have a pulse width of a magnitude corresponding to the PWM data voltage.

The display apparatus 1 according to an embodiment of the disclosure may apply the same PAM data voltage to all the pixel circuits 131P. That is, although a PAM data voltage having the same magnitude is applied to the pixel circuits 131P, the magnitude of the PAM data voltage applied to the pixel circuits 131P may change according to whether the display apparatus 1 operates in a normal mode or in a power saving mode.

More specifically, by adjusting the PAM data voltage in the power saving mode to supply smaller driving current to the inorganic light emitting device 120 than that supplied in the normal mode, consumption power may be reduced.

A PAM data voltage that is applied in the normal mode and a PAM data voltage that is applied in the power saving mode may have been set in advance. Particularly, an increase amount or a decrease amount of the PAM data voltage that is applied in the power saving mode may be set in consideration of power saving efficiency, etc. In the current embodiment of the disclosure, there may be no limitation on the magnitude of the PAM data voltage as long as driving current having a smaller amplitude is applied to pixels in the power saving mode than in the normal mode.

In the above-described example of the pixel circuit 131P, a P-channel metal-oxide-semiconductor (PMOS) transistor is used as a driving transistor. As such, in the case of the driving transistor being a PMOS transistor, a greater PAM data voltage than that applied in the normal mode may be applied in the power saving mode.

However, an N-channel metal-oxide-semiconductor (NMOS) transistor may be used as a driving transistor. In this case, a smaller PAM data voltage than that applied in the normal mode may be applied in the power saving mode.

That is, in the power saving mode of the display apparatus 1, the driver IC 200 may decrease (in the case of a driving transistor being a NMOS driving transistor) or increase (in the case of a driving transistor being a PMOS driving transistor) a PAM data voltage to be applied to the pixel circuits 131P to thereby reduce an amplitude of driving current that is applied to the inorganic light emitting device 120.

The timing controller 500 or the main controller 300 may determine whether to enter the power saving mode or to return to the normal mode, and the driver IC 200 may apply different magnitudes of PAM data voltages to the display panel 100 according to whether the display apparatus 1 operates in the normal mode or in the power saving mode.

Whether to enter the power saving mode may be determined by the timing controller 500 or the main controller 300, or based on a user input received through the inputter 420.

For example, the timing controller 500 or the main controller 300 may determine whether to enter the power saving mode based on information about an environment where the display apparatus 1 is located. The information about the environment where the display apparatus 1 is located may include illuminance, and may be obtained by a sensing device, such as a camera, an illuminance sensor, etc., provided in the display apparatus 1.

Alternatively, in the case in which the display apparatus 1 is located outdoor, whether to enter the power saving mode may be determined according to time zones. In daytime, the timing controller 500 or the main controller 300 may operate the display apparatus 1 in the normal mode to implement high brightness, and in nighttime, the timing controller 500 or the main controller 300 may operate the display apparatus 1 in the power saving mode to reduce consumption power.

As another example, the timing controller 500 or the main controller 300 may determine whether to enter the power saving mode according to whether a user watches the display apparatus 1. In a case in which no user input is received through the inputter 420 for a preset time period or more, the timing controller 500 or the main controller 300 may convert an operation mode of the display apparatus 1 from the normal mode to the power saving mode by determining that a user does not watch the display apparatus 1.

Also, in a case in which no user is sensed for a preset time period or more by a camera or another sensor installed in the display apparatus, the timing controller 500 or the main controller 300 may determine that a user does not watch the display apparatus 1.

Also, in a case in which the display apparatus 1 is located in a public place, whether to enter the power saving mode may be determined according to time zones. By operating the display apparatus 1 in the normal mode at a time zone with a large floating population, high brightness may be implemented, and by operating the display apparatus 1 in the power saving mode at a time zone with a small floating population, consumption power may be reduced. The time zone at which the display apparatus 1 operates in the normal mode and the time zone at which the display apparatus 1 operates in the power saving mode may be set or changed by a user.

In the case in which whether to enter the power saving mode is determined based on a user input, a power saving mode button for enabling a user to select the power saving mode may be provided in the inputter 420, and, in response to a user's selection of the power saving mode button, the timing controller 500 or the main controller 300 may convert an operation mode of the display apparatus 1 from the normal mode to the power saving mode.

The above-described conditions may be examples that are applicable to the display apparatus 1 according to an embodiment of the disclosure. However, various other conditions for determining conversion to the power saving mode may be used in addition to the above-described conditions.

Figure 10:
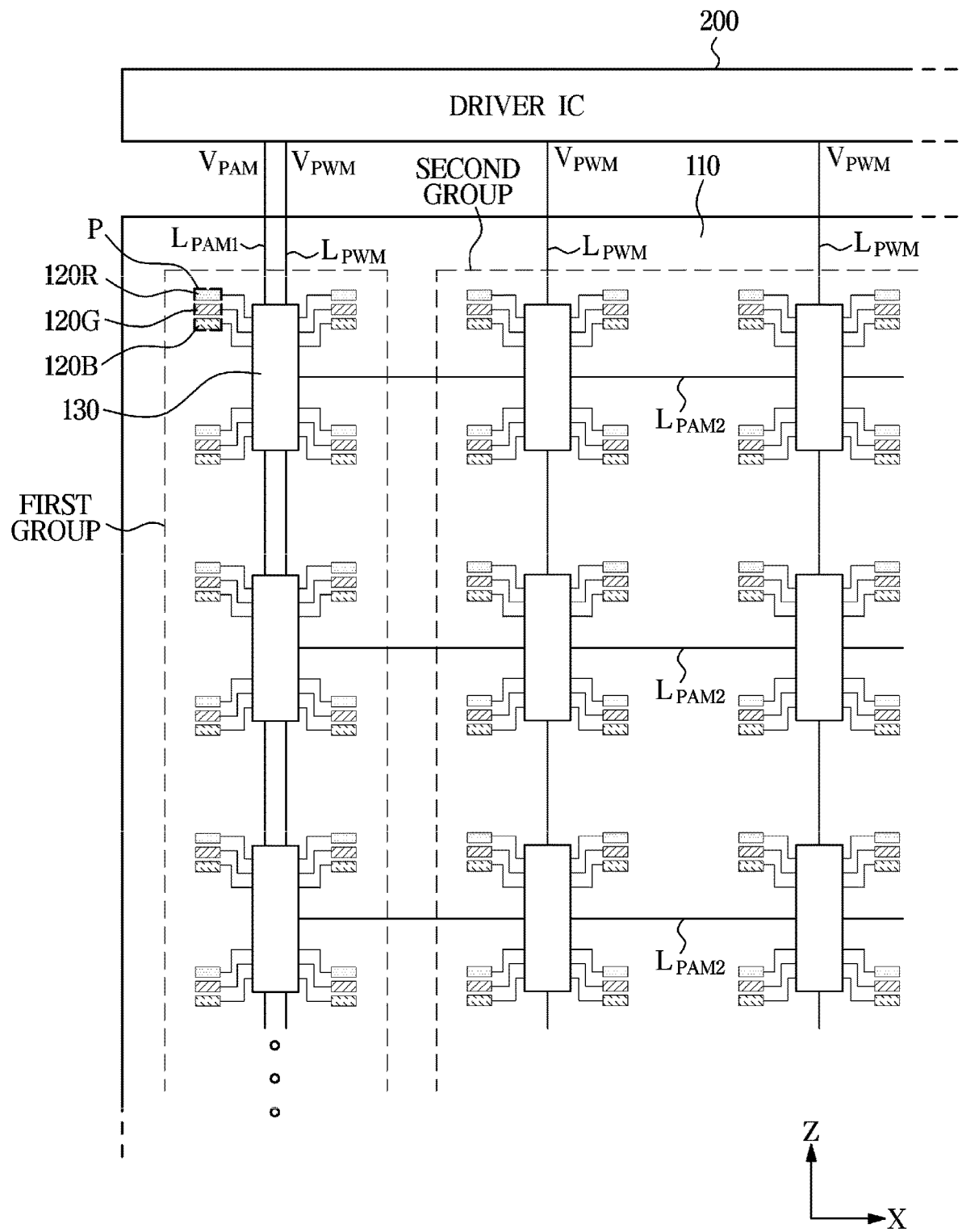
FIGS. 10 and 11 are diagrams of examples of wiring structures for supplying a PAM data voltage to a plurality of pixel circuits in a display apparatus according to embodiments of the disclosure.
Figure 11:
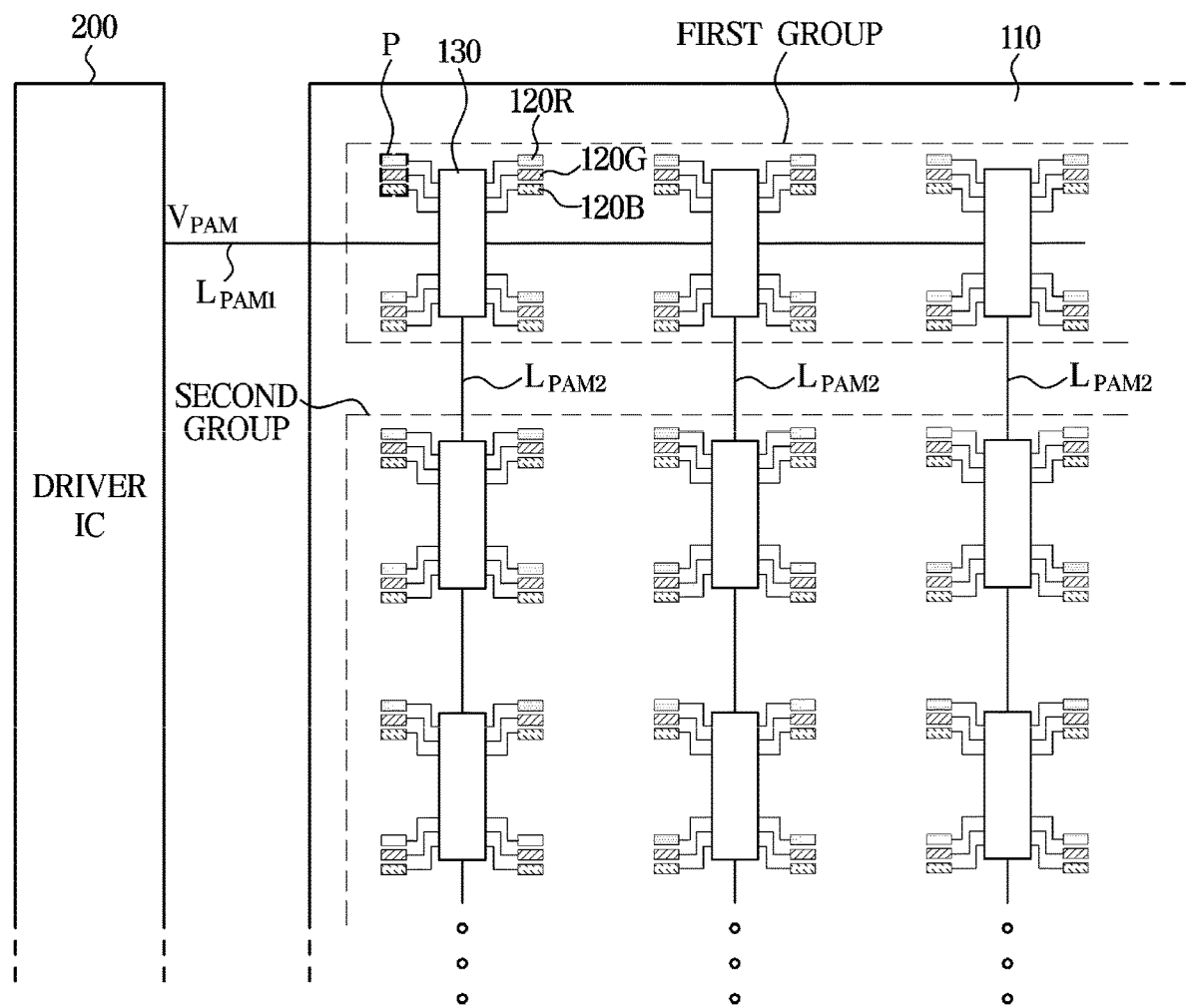

FIGS. 10 and 11 are diagrams illustrating examples of wiring structures for supplying a PAM data voltage to a plurality of pixel circuits in a display apparatus according to embodiments of the disclosure.

In the current examples, a case in which one micro pixel controller 130 controls pixels having a 2×2 arrangement will be described as an example.

Referring to FIG. 10, the driver IC 200 may be electrically connected to the micro pixel controllers 130 through a PAM wiring $L_{PAM}$ for transferring a PAM data voltage $V_{PAM}$ and a PWM wiring $L_{PWM}$ for transferring a PWM data voltage $V_{PWM}$.

The PWM wiring $L_{PWM}$ may be connected to the micro pixel controllers 130 in unit of a column. As shown in FIG. 10, PWM wirings $L_{PWM}$ may be provided by the number of micro pixel controllers 130 aligned to be adjacent to each other in the row direction, and a PWM wiring $L_{PWM}$ may be connected to each micro pixel controller 130. Alternatively, PWM wirings $L_{PWM}$ may be provided by the number of columns configured by a plurality of pixels, and a micro pixel controller 120 may be connected to PWM wirings $L_{PWM}$ by the number of columns which the micro pixel controller 120 controls, that is, the number of columns on which pixels to be controlled are arranged. In drawings following FIG. 10, the PWM wirings $L_{PWM}$ are not shown.

As described above, a PAM data voltage having the same magnitude may be applied to the plurality of pixels P configuring the display panel 100. Accordingly, the display apparatus 1 according to an embodiment of the disclosure may reduce wiring complexity and simplify a manufacturing process by reducing the number of PAM wirings $L_{PAM}$ connecting the driver IC 200 to the display panel 100.

As shown in FIG. 10, the driver IC 200 may be connected to the display panel 100 through a single PAM wiring $L_{PAM1}$. The PAM wiring $L_{PAM1}$ may transfer a PAM data voltage supplied from the driver IC 200 to a first group of micro pixel controllers 130 that are adjacent to each other in the column direction (Z axis direction).

In the current embodiment of the disclosure, the first group of the micro pixel controllers 130 may mean micro pixel controllers 130 which receive a PAM data voltage from the PAM wiring $L_{PAM1}$ connected to the driver IC 200, or micro pixel controllers 130 to which a PAM data voltage is first transferred and which are adjacent to each other in the column or row direction.

The remaining micro pixel controllers 130 may be defined to belong to a second group. The micro pixel controllers 130 belonging to the second group may receive a PAM data voltage from the micro pixel controllers 130 belonging to the first group.

In the current example, a wiring for transferring a PAM data voltage from the driver IC 200 to the micro pixel controllers 130 of the first group is referred to as a first wiring $L_{PAM1}$, and a wiring for transferring a PAM data voltage to the micro pixel controllers 130 of the second group is referred to as a second wiring $L_{PAM2}$.

Referring to the example of FIG. 10, the first group of the micro pixel controllers 130 may receive a PAM data voltage through the first wiring $L_{PAM1}$. In this case, the first group of the micro pixel controllers 130 may transfer the PAM data voltage to the second group of the micro pixel controllers 130 being adjacent to the first group of the micro pixel controllers 130 in the row direction, through the second wiring $L_{PAM2}$.

Referring to the example of FIG. 11, the first group of the micro pixel controllers 130 may receive a PAM data voltage through the first wiring $L_{PAM1}$. In this case, the first group of the micro pixel controllers 130 may transfer the PAM data voltage to the second group of the micro pixel controllers 130 being adjacent to the first group of the micro pixel controllers 130 in the column direction, through the second wiring $L_{PAM2}$.

Thereby, all the first and second groups of the micro pixel controllers 130 may receive the PAM data voltage having the same magnitude, transferred from the first wiring $L_{PAM1}$.

According to the examples of FIGS. 10 and 11, the PAM data voltage transferred from the first wiring $L_{PAM1}$ may be transferred to the second group of the micro pixel controllers 130 via the first group of the micro pixel controllers 130. In this case, the first group of the micro pixel controllers 130 may include a regulator for performing a voltage adjustment function. The regulator may compensate a voltage drop generated by an IR drop, etc. upon transferring of the PAM data voltage from the driver IC 200, and transfer a compensated voltage to the second group of the micro pixel controllers 130.

Figure 12:
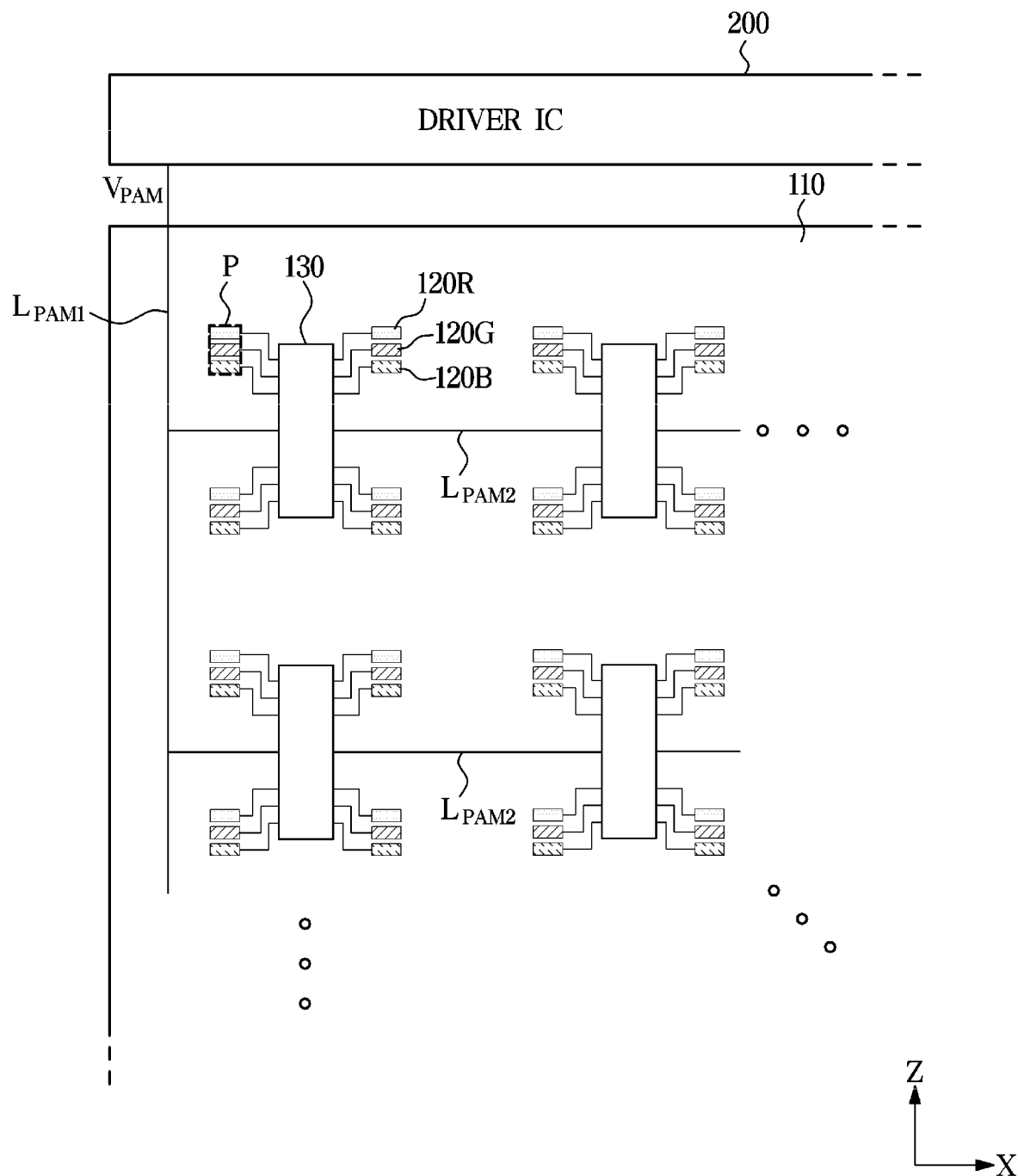
FIGS. 12 and 13 are diagrams of examples of wiring structures for supplying a PAM data voltage to a plurality of pixel circuits in a display apparatus according to embodiments of the disclosure.
Figure 13:
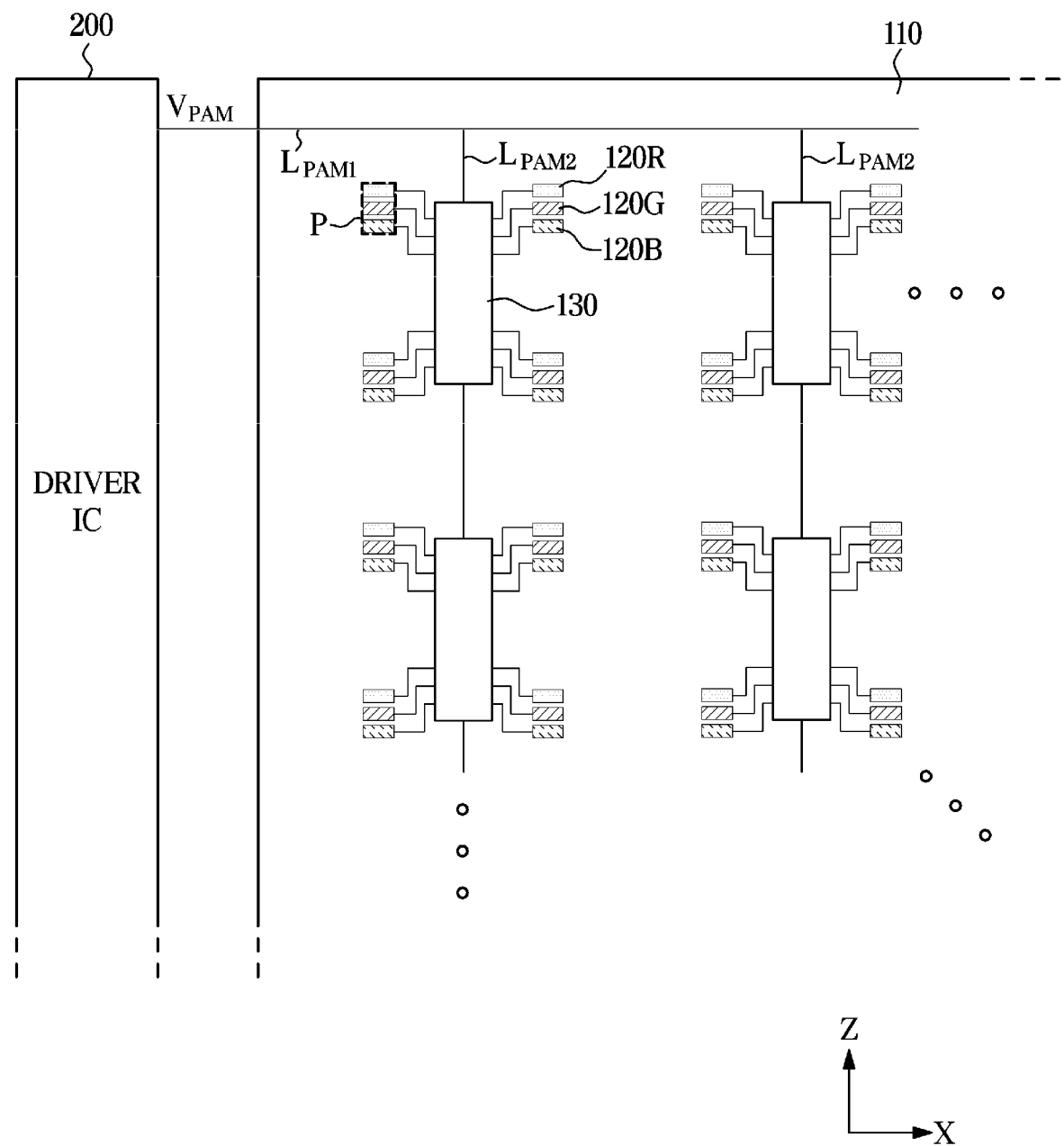

FIGS. 12 and 13 are diagrams illustrating other examples of wiring structures for supplying a PAM data voltage to a plurality of pixel circuits in a display apparatus according to embodiments of the disclosure.

In the current examples, a case in which one micro pixel controller 130 controls pixels arranged in a 2×2 form will be described as an example.

Referring to the example of FIG. 12, a PAM wiring $L_{PAM1}$ connected to the driver IC 200 may diverge on the module substrate 110. In the current example, the PAM wiring $L_{PAM1}$ connected to the driver IC 200 is referred to as a first wiring, and a plurality of PAM wirings $L_{PAM2}$ diverging from the first wiring are referred to as second wirings.

According to the example of FIG. 12, the second wirings $L_{PAM2}$ may be arranged in the row direction. Accordingly, one second wiring $L_{PAM2}$ of the plurality of second wirings $L_{PAM2}$ diverging from the first wiring $L_{PAM1}$ may transfer a PAM data voltage $V_{PAM}$ to micro pixel controllers 130 being adjacent to each other in the row direction.

According to the example of FIG. 13, a plurality of second wirings $L_{PAM2}$ may be arranged in the column direction. Accordingly, one second wiring $L_{PAM2}$ of the plurality of second wirings $L_{PAM2}$ diverging from the first wiring $L_{PAM1}$ may transfer a PAM data voltage $V_{PAM}$ to micro pixel controllers 130 being adjacent to each other in the column direction.

Micro pixel controllers 130 arranged to be adjacent to each other in the row or column direction may receive a PAM data voltage through a common wiring, or a PAM data voltage may be transferred between the micro pixel controllers 130. In the latter case, a PAM data voltage may be input to a micro pixel controller 130, output from the micro pixel controller 130, and then input to the next micro pixel controller 130 being adjacent to the micro pixel controller 130 in the row or column direction.

FIG. 14 shows a brightness difference between a case in which a display apparatus according to an embodiment of the disclosure operates in a normal mode and a case in which the display apparatus operates in a power saving mode.

The timing controller 500 or the main controller 300 may determine entering the power saving mode. In this case, the driver IC 200 may adjust a PAM data voltage to reduce an amplitude of driving current that is applied to all the pixels P included in the display panel 100. The reduced amplitude of the driving current may be the same for the plurality of pixels. Accordingly, in the power saving mode, as shown in FIG. 14, the display apparatus 1 may display a darker image throughout the entire area than in the normal mode.

Figure 15:
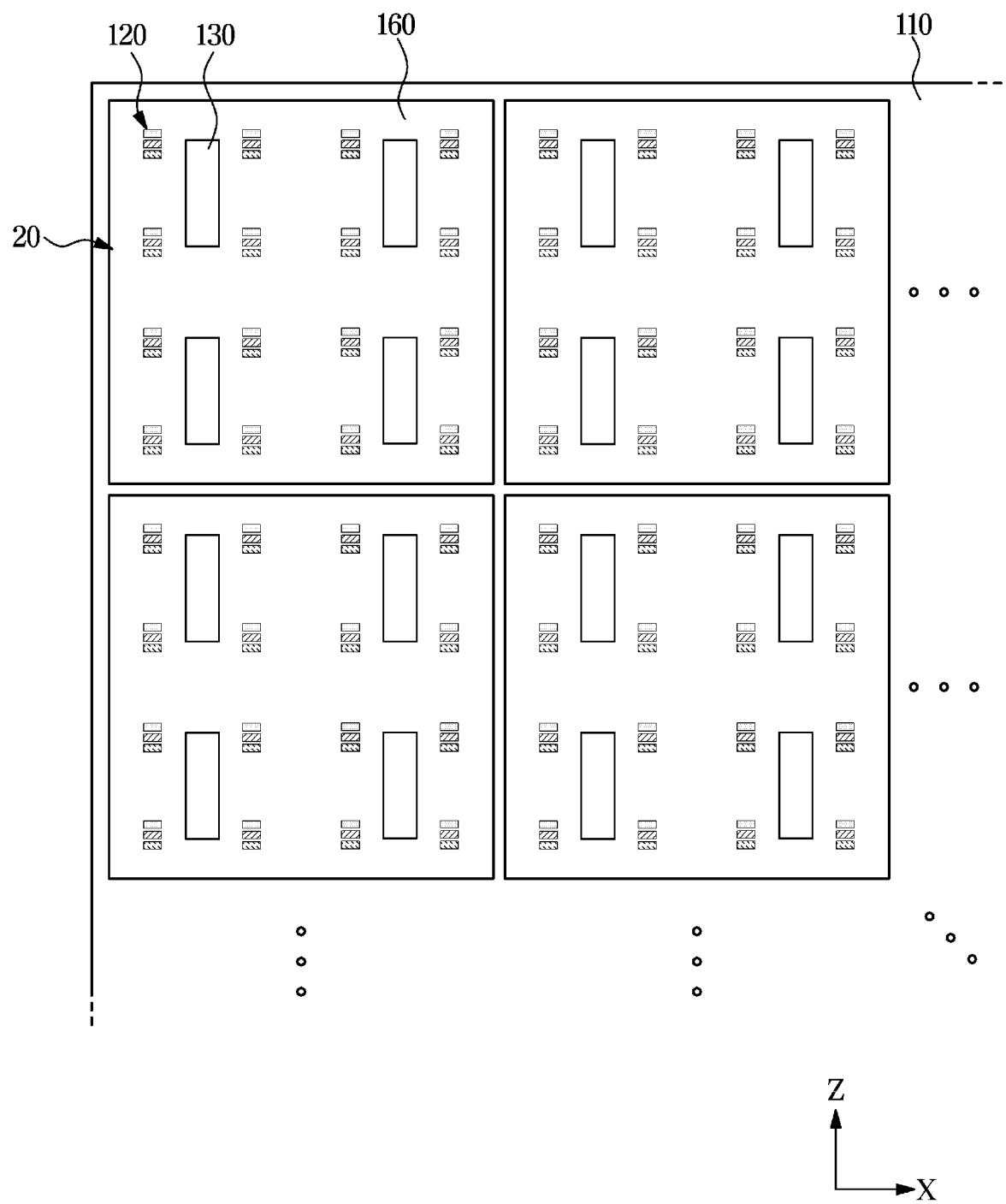
FIG. 15 is a diagram illustrating an embodiment in which package substrates are added between a module substrate and micro pixel controllers, in a display apparatus according to an embodiment of the disclosure.

FIG. 15 is a diagram illustrating an embodiment in which package substrates are added between a module substrate and micro pixel controllers, in a display apparatus according to an embodiment of the disclosure.

Referring to FIG. 15, a plurality of package substrates 160 may be arranged on the module substrate 110, and a plurality of pixels and a plurality of micro pixel controllers 130 may be arranged on each of the plurality of package substrates 160.

A package substrate 160 and a plurality of pixels P and a plurality of micro pixel controllers 130 arranged on the package substrate 160 may construct a micro pixel package. In the current example, a case in which a micro pixel package 20 includes a plurality of micro pixel controllers 130 and a plurality of pixels to be controlled by the plurality of micro pixel controllers 130 is shown. However, a micro pixel package 20 may include one micro pixel controller 130 and a plurality of pixels to be controlled by the micro pixel controller 130.

In the current embodiment of the disclosure, because a plurality of inorganic light emitting devices 120 and a plurality of micro pixel controllers 130 for controlling the inorganic light emitting devices 120 are provided as one package, reliability of inspection on pixel circuits or inspection on inorganic light emitting devices may be improved, such inspection may be quickly performed, and defective products may be easily replaced by mounting packages determined to be adequate products on the module substrate 110.

Even in the case in which the inorganic light emitting devices 120 and the micro pixel controllers 130 are mounted on the package substrate 160, not on the module substrate 110, descriptions about a positional relationship between pixels P or a positional relationship between pixels P and micro pixel controllers 130, descriptions about PAM wirings, etc. may be the same as the corresponding ones given in the embodiments described above.

Figure 16:
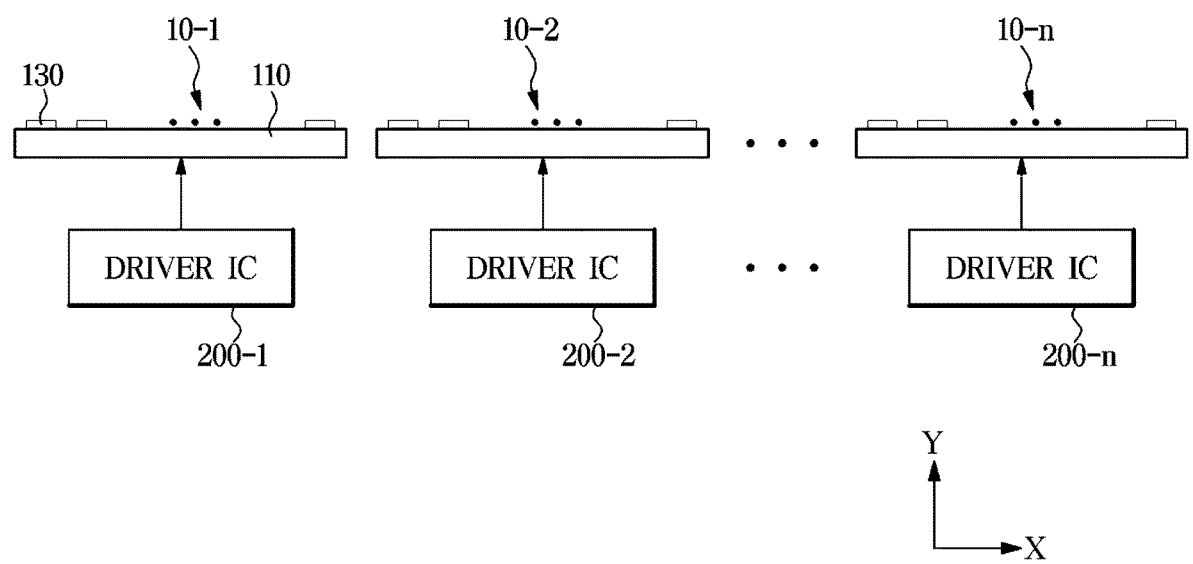
FIGS. 16 to 18 are diagrams illustrating a connection relationship between a plurality of display modules and other components in a display apparatus according to an embodiment of the disclosure.
Figure 17:
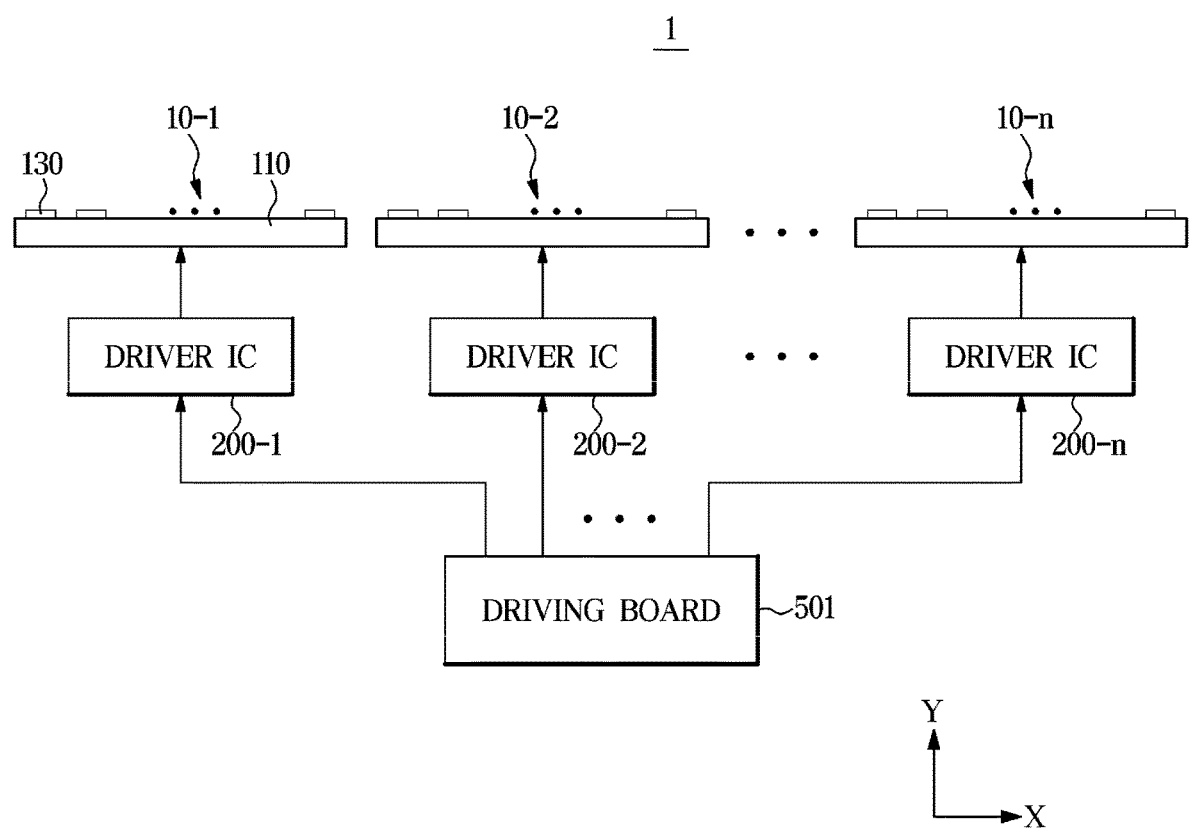
Figure 18:
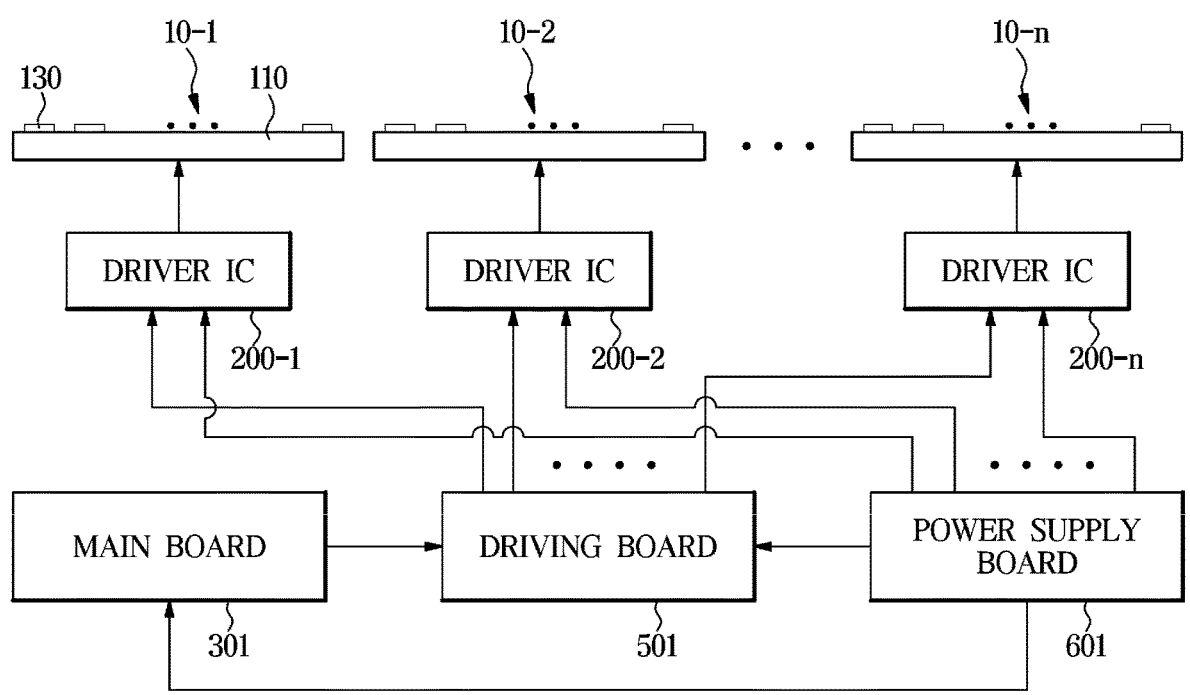

FIGS. 16, 17, and 18 are diagrams illustrating a connection relationship between a plurality of display modules and other components in a display apparatus according to embodiments of the disclosure.

As described above, the plurality of display modules 10-1, 10-2, . . . , 10-$n$ may be tiled to implement the display apparatus 1 having a large size screen. Because FIGS. 16 to 18 show the display apparatus 1 on an XY plane, a one-dimensional arrangement of a plurality of display modules 10-1, 10-2, . . . , 10-P is shown. However, as described above with reference to FIG. 1, the plurality of display modules 10-1, 10-2, . . . , 10-$n$ may be arranged two-dimensionally.

Referring to FIG. 16, each of the plurality of display modules 10 may include the driver IC 200 for driving the display panel 100. The driver IC 200 may be electrically connected to the display panel 100 by adopting one of various bonding methods, such as Chip on Film (COF), Film on Glass (FOG) bonding, Chip on Glass (COG) bonding, Tape Automated Bonding (TAB), etc.

For example, the display panel 100 may be connected to a FPCB through a film on which the driver IC 200 is mounted. The FPCB may be connected to a driving board 501 to electrically connect the display module 10 to the driving board 501, as shown in FIG. 17.

The driving board 501 may include the timing controller 500. Accordingly, the driving board 501 may be also referred to as a T-con board. The plurality of display modules 10-1, 10-2, . . . , 10-$n$ may receive image data, a timing control signal, etc. from the driving board 501.

Also, referring to FIG. 18, the display apparatus 1 may further include a main board 301 and a power supply board 601. The main controller 300 may be provided on the main board 301, and a power supply circuit for supplying a supply voltage to the plurality of display modules 10-1, 10-2, ..., 10-n may be provided on the power supply board 601.

The power supply board 601 may be electrically connected to the plurality of display modules 10-1, 10-2, ..., 10-n through the FPCB, and supply a supply voltage VDD, a reference voltage Vss, various operation voltages, etc. to the plurality of display modules 10-1, 10-2, ..., 10-n connected to the power supply board 601 through the FPCB.

In the above-described example, the plurality of display modules 10-1, 10-2, ..., 10-n share the driving board 501. However, the respective display modules 10 may be connected to different driving boards 501. Alternatively, the plurality of display modules 10-1, 10-2, ..., 10-n may be grouped into several groups, and each group may be connected to one driving board 501.

Figure 19:
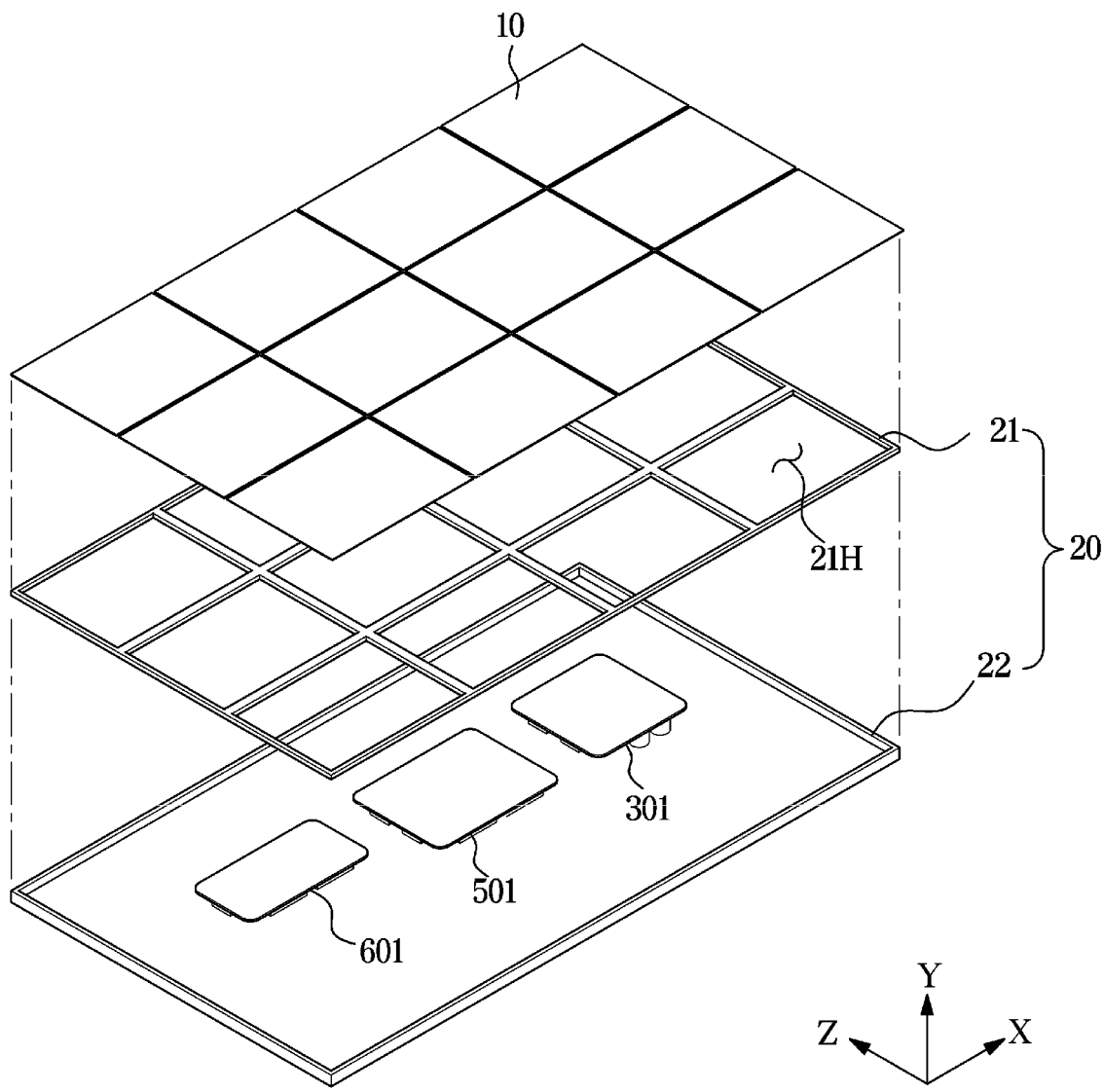
FIG. 19 is a diagram illustrating an example of a method by which a plurality of display modules are coupled with a housing, in a display apparatus according to an embodiment of the disclosure.

FIG. 19 is a diagram illustrating an example of a method by which a plurality of display modules are coupled with a housing, in a display apparatus according to an embodiment of the disclosure.

As described above, the plurality of display modules 10 may be arranged in a form of a two-dimensional matrix, and fixed to the housing 20. Referring to the example of FIG. 19, the plurality of display modules 10 may be mounted in a frame 21, and the frame 21 may have a two-dimensional mesh structure of which some areas corresponding to the plurality of display modules 10 open.

More specifically, a plurality of openings 21H corresponding to the number of the display modules 10 may be formed in the frame 21, and the openings 21H may have the same arrangement as the plurality of display modules 10.

Edge areas of a bottom of each display module 10 may be mounted on the frame 21. The edge areas of the bottom may be areas on which neither circuit devices nor wirings are formed.

The plurality of display modules 10 may be mounted on the frame 21 by using magnetism by a magnet, by being coupled with the frame 21 by a mechanical structure, or by being bonded to the frame 21 by an adhesive. A method by which the display modules 10 are mounted on the frame 21 is not limited.

The driving board 51, the main board 301, and the power supply board 601 may be positioned below the frame 21, and electrically connected to the plurality of display modules 10 through the openings 21H formed in the frame 21.

A bottom of the frame 21 may be coupled with a lower cover 22, and the lower cover 22 may form a bottom outer appearance of the display apparatus 1.

In the above-described example, a case in which the display modules 10 are arranged two-dimensionally has been described as an example. However, the display modules 10 may be arranged one-dimensionally, and in this case, the frame 21 may also change to a one-dimensional mesh structure.

Also, the above-described shape of the frame 21 is an example that is applicable to embodiments of the display apparatus 1, and various shapes of frames 21 may be applied to fix the display modules 10.

Figure 20:
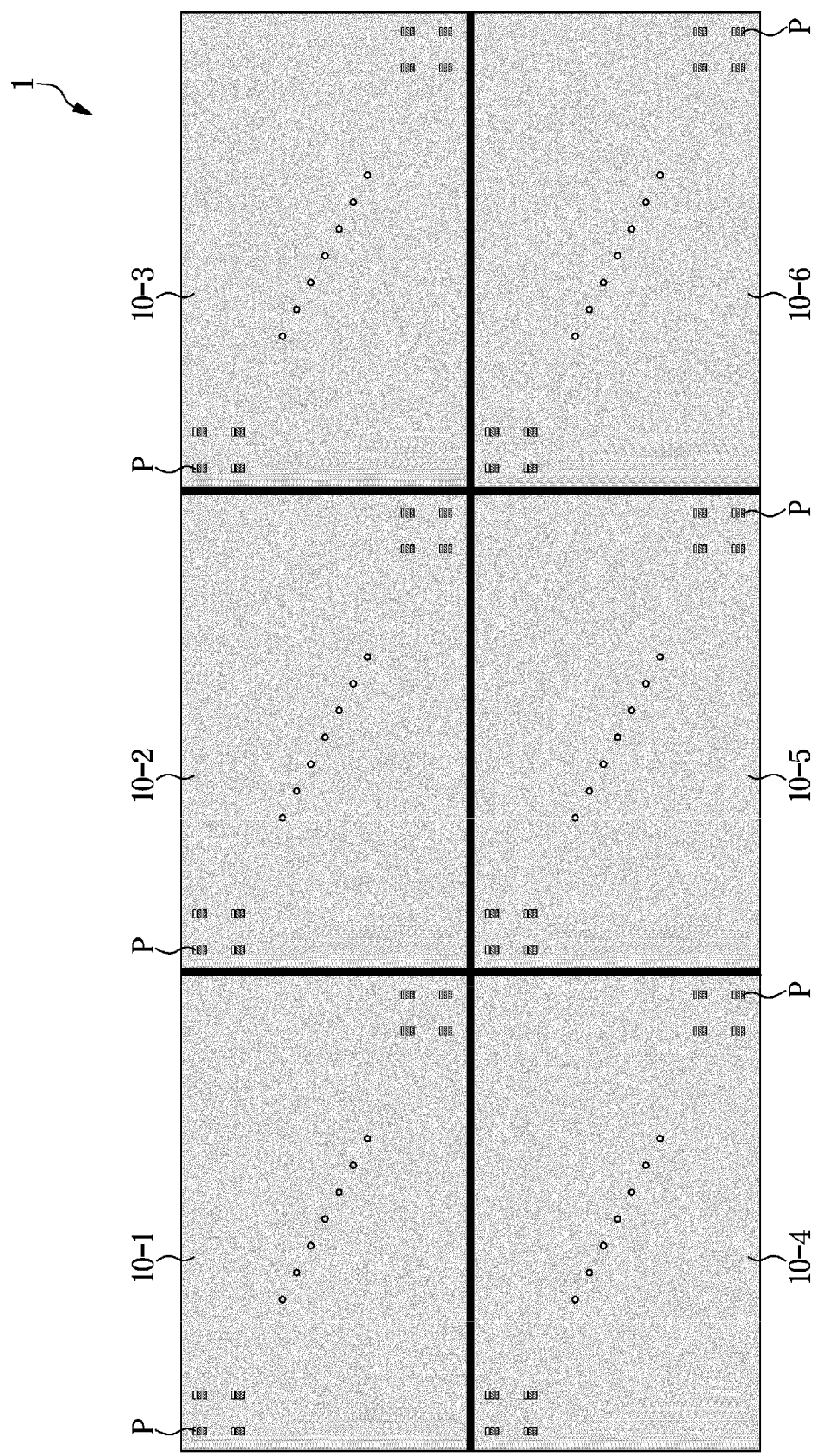
FIG. 20 is a diagram illustrating an example of black matrix (BM) processing that is performed on a plurality of display modules in a display apparatus according to an embodiment of the disclosure.

FIG. 20 is a diagram illustrating an example of black matrix (BM) processing that is performed on a plurality of display modules in a display apparatus according to an embodiment of the disclosure.

Referring to FIG. 20, BM processing may be performed on each of a plurality of display modules 10-1 to 10-6 to block unnecessary light except for light required for implementing images, prevent light from being diffused-reflected in gaps between pixels, and improve contrast.

For example, by applying one of various BM processing methods, such as printing black ink on the upper surface of the module substrate 110, performing patterning with a black photosensitive material, or using black ACF upon mounting the inorganic light emitting devices 120 on the module substrate 110, a black matrix layer may be formed on an upper surface of the module substrate 110.

Also, by performing BM processing on the upper surfaces of the micro pixel controllers 130, a black matrix layer may be formed.

Also, by performing BM processing on spaces between the plurality of display modules 10, light may be prevented from being diffused-reflected in gaps between the display modules 10.

Figure 21:
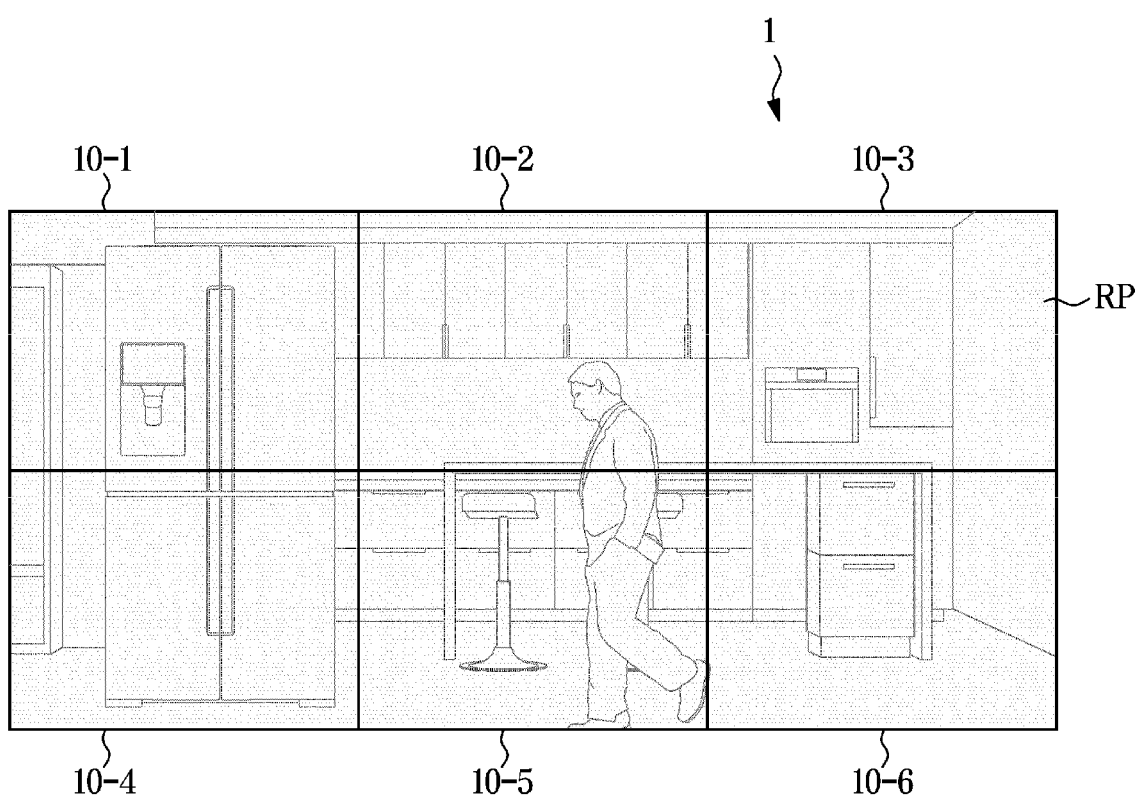
FIGS. 21 and 22 are diagrams illustrating examples of power saving areas that are settable in a case in which a plurality of display modules construct a display apparatus, in a display apparatus according to an embodiment of the disclosure.
Figure 22:
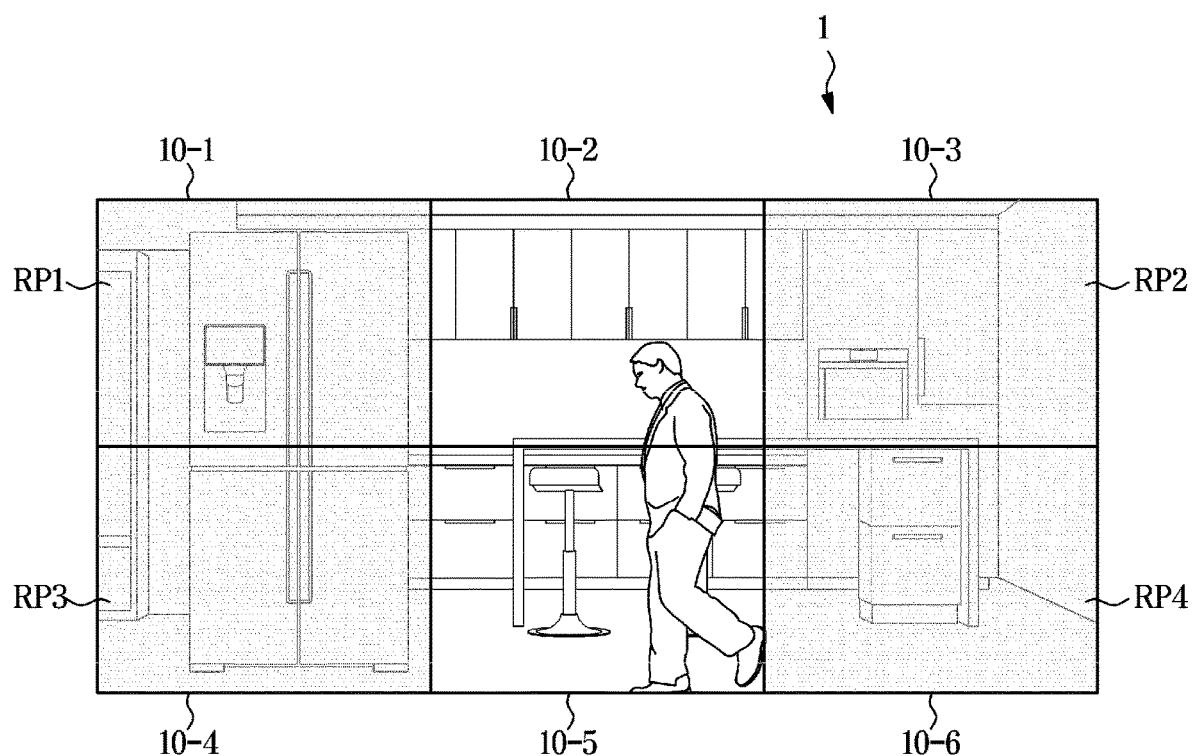

FIGS. 21 and 22 are diagrams illustrating examples of power saving areas that are settable in a case in which a plurality of display modules construct a display apparatus, in a display apparatus according to embodiments of the disclosure.

The above descriptions about the display modules 10 may be applied even to a case in which the plurality of display modules 10-1, 10-2, ..., 10-6 construct the display apparatus 1.

In each display module 10, a wiring structure in which driving current having the same amplitude is applied to each of pixels may be provided. Accordingly, in the display apparatus 1 operating in the power saving mode, as shown in FIG. 21, brightness of all of the plurality of display modules 10-1, 10-2, ..., 10-6 may be lowered. That is, the entire of the plurality of display modules 10-1, 10-2, ..., 10-6 may be set to a power saving area RP.

Alternatively, the plurality of display modules 10-1, 10-2, ..., 10-6 may be set to different levels of brightness. That is, in the power saving mode, different PAM data voltages may be applied to the respective display modules 10-1, 10-2, ..., 10-6 according to locations of the display modules 10-1, 10-2, ..., 10-6.

Referring to the example of FIG. 22, in the display apparatus 1 operating in the power saving mode, by adjusting a magnitude of a PAM data voltage that is applied to some display modules 10-1, 10-3, 10-4, and 10-6, an amplitude of driving current that is supplied to pixels included in the corresponding display modules 10-1, 10-3, 10-4, and 10-6 may be reduced. That is, by setting some display modules 10-1, 10-3, 10-4, and 10-6 to power saving areas RP1, RP2, RP3, and RP4, brightness of images that are displayed on the corresponding display modules 10-1, 10-3, 10-4, and 10-6 may be reduced.

Alternatively, it may be possible to control reduction degrees of brightness differently according to display modules. In this case, in the display apparatus 1 operating in the power saving mode, brightness of all the plurality of display modules 10-1, 10-2, ..., 10-6 may be reduced, and brightness of images that are displayed on some display modules 10-1, 10-3, 10-4, and 10-6 may be adjusted to become darker. A magnitude of a PAM data voltage that is applied to some display modules 10-1, 10-3, 10-4, and 10-6 may be adjusted to a greater or smaller value.

In this case, a power saving area or a darker area in a power saving area may have been set in advance, or the time controller 500 or the main controller 300 may determine a power saving area or a darker area in a power saving area based on image data.

For example, edge areas of the display apparatus 1 except for a center area of the display apparatus 1 may have been set in advance to power saving areas, or the time controller 500 or the main controller 300 may determine, based on image data, a background area in which neither a human nor an animal is not located or a background area in which no moving object is located to be a power saving area. Alternatively, an area in which a dark color is displayed may be determined to be a power saving area.

However, embodiments of the display apparatus 1 are not limited to the above-described example, and a power saving area may be determined by various other methods than the above-described method.

According to the display module according to an aspect of the disclosure and the display apparatus including the display module, by providing a thin film transistor circuit for driving inorganic light emitting devices as a separate chip, circuitry inspection, circuitry replacement, and a manufacturing process of the display module or a manufacturing process of the display apparatus including the display module may be facilitated.

The foregoing description of the disclosure illustrates and describes example embodiments of the disclosure but, as mentioned above, it is to be understood that the disclosure is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the disclosure and to enable others skilled in the art to utilize the disclosure in such, or other, embodiments and with the various modifications required by the particular applications or uses of the disclosure. Accordingly, the description is not intended to limit the disclosure to the form disclosed herein. Also, it is intended that the appended claims are construed to include alternative embodiments.

What is claimed is:

1. A display module comprising:
a module substrate;
a plurality of pixels provided on the module substrate; and
a plurality of micro pixel controllers provided in spaces between the plurality of pixels and mounted on the module substrate,
wherein each micro pixel controller of the plurality of micro pixel controllers is provided between at least two pixels of the plurality of pixels and configured to supply driving current to the at least two pixels of the plurality of pixels,
wherein each micro pixel controller of the plurality of micro pixel controllers comprises a plurality of pixel circuits,
wherein the plurality of micro pixel controllers comprise a first group of micro pixel controllers that are connected in series and arranged on the module substrate in a column direction, and a second group of micro pixel controllers that are arranged on the module substrate in the column direction and a row direction,
wherein each of the plurality of pixel circuits is configured to,
based on a first voltage being applied to the micro pixel controller, control an amplitude of the driving current based on the first voltage, and
based on a second voltage being applied to the micro pixel controller, control a pulse width of the driving current based on the second voltage, and
wherein based on the display module being in a power saving mode, the first voltage is adjusted to decrease a brightness of the plurality of pixels,
wherein the module substrate comprises:
a first single wiring arranged along the micro pixel controllers of the first group in the column direction, wherein the first voltage is applied to the micro pixel controllers of the first group through the first single wiring; and
a plurality of second wirings diverging from the first single wiring, wherein each of the plurality of second wirings is connected to the first single wiring and extends from the first single wiring in the row direction, and
wherein each micro pixel controller of the micro pixel controllers of the first group is configured to:
through the first single wiring, receive the first voltage, and
through each of the plurality of second wirings, transfer the first voltage to another micro pixel controller, among the micro pixel controllers of the second group, which is adjacent to the each micro pixel controller in the row direction, such that all of the plurality of micro pixel controllers receive the first voltage that has a same magnitude.

2. A display apparatus comprising:
a module substrate;
a plurality of pixels provided on the module substrate;
a plurality of micro pixel controllers provided in spaces between the plurality of pixels and mounted on the module substrate, wherein each micro pixel controller of the plurality of micro pixel controllers is provided between at least two pixels of the plurality of pixels and configured to supply driving current to the at least two pixels of the plurality of pixels; and
a driver integrated circuit (IC) configured to apply a first voltage and a second voltage to the plurality of micro pixel controllers,
wherein each micro pixel controller of the plurality of micro pixel controllers comprises a plurality of pixel circuits,
wherein the plurality of micro pixel controllers comprise a first group of micro pixel controllers that are connected in series and arranged on the module substrate in a column direction, and a second group of micro pixel controllers that are arranged on the module substrate in the column direction and a row direction,
wherein each of the plurality of pixel circuits is configured to:
control an amplitude of the driving current according to the first voltage, and
control a pulse width of the driving current according to the second voltage, and
wherein the driver IC is further configured to, based on the display apparatus being in a power saving mode, apply the first voltage adjusted to decrease a brightness of the plurality of pixels,
wherein the module substrate comprises:
a first single wiring arranged along the micro pixel controllers of the first group in the column direction, wherein the first voltage is applied, by the driver IC, to the micro pixel controllers of the first group; and
a plurality of second wirings diverging from the first single wiring, wherein each of the plurality of second wirings is connected to the first single wiring and extends from the first single wiring in the row direction, and wherein each micro pixel controller of the micro pixel controllers of the first group is configured to:

through the first single wiring, receive the first voltage, and through each of the plurality of second wirings, transfer the first voltage to another micro pixel controller, among the micro pixel controllers of the second group, which is adjacent to the each micro pixel controller in the row direction, such that all of the plurality of micro pixel controllers receive the first voltage that has a same magnitude.

3. The display module of claim 1, wherein the plurality of pixels are directly mounted on the module substrate, and the plurality of pixel circuits in the each micro pixel controller are not directly mounted on the module substrate.

4. The display apparatus of claim 2, wherein the plurality of pixels are directly mounted on the module substrate, and the plurality of pixel circuits in the each micro pixel controller are not directly mounted on the module substrate.

\* \* \* \* \*